(12) United States Patent
Northrup et al.

(10) Patent No.: US 9,401,452 B2
(45) Date of Patent: Jul. 26, 2016

(54) P-SIDE LAYERS FOR SHORT WAVELENGTH LIGHT EMITTERS

(75) Inventors: John E. Northrup, Palo Alto, CA (US); Bowen Cheng, Atherton, CA (US); Christopher L. Chua, San Jose, CA (US); Thomas Wunderer, Palo Alto, CA (US); Noble M. Johnson, Menlo Park, CA (US); Zhihong Yang, San Jose, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 191 days.

(21) Appl. No.: 13/619,598

(22) Filed: Sep. 14, 2012

(65) Prior Publication Data
US 2014/0231745 A1  Aug. 21, 2014

(51) Int. Cl.
| | |
|---|---|
| H01L 33/00 | (2010.01) |
| H01L 33/06 | (2010.01) |
| H01L 33/14 | (2010.01) |
| H01L 33/32 | (2010.01) |
| H01L 21/02 | (2006.01) |
| B82Y 20/00 | (2011.01) |
| H01S 5/042 | (2006.01) |
| H01S 5/20 | (2006.01) |
| H01S 5/32 | (2006.01) |
| H01S 5/343 | (2006.01) |

(Continued)

(52) U.S. Cl.
CPC .............. *H01L 33/06* (2013.01); *B82Y 20/00* (2013.01); *H01L 21/0237* (2013.01); *H01L 21/0251* (2013.01); *H01L 21/0254* (2013.01); *H01L 21/0262* (2013.01); *H01L 21/02458* (2013.01); *H01L 21/02507* (2013.01); *H01L 33/32* (2013.01); *H01S 5/3216* (2013.01); *H01L 33/007* (2013.01); *H01L 33/0075* (2013.01); *H01L 33/14* (2013.01); *H01S 5/0421* (2013.01); *H01S 5/0422* (2013.01); *H01S 5/2009* (2013.01); *H01S 5/3063* (2013.01); *H01S 5/3202* (2013.01); *H01S 5/3211* (2013.01); *H01S 5/3404* (2013.01); *H01S 5/34333* (2013.01)

(58) Field of Classification Search
CPC ..... H01L 33/06; H01L 33/0075; H01L 33/32; H01L 33/007; H01L 33/14
USPC ........................................................ 257/103
See application file for complete search history.

(56) References Cited

U.S. PATENT DOCUMENTS

| 6,128,535 A | 10/2000 | Maarse |
| 6,515,313 B1 | 2/2003 | Ibbetson et al. |

(Continued)

OTHER PUBLICATIONS

Allerman et al., "Growth and Characterization of Mg-Doped AlGaN—AlN Short-Period Superlattices for Deep-UV Optoelectronic Devices", Journal of Crystal Growth, 312, 2010, pp. 756-761.

(Continued)

*Primary Examiner* — Kevin Parendo
(74) *Attorney, Agent, or Firm* — Hollingsworth Davis, LLC

(57) ABSTRACT

A light emitting device includes a p-side heterostructure having a short period superlattice (SPSL) formed of alternating layers of $Al_{xhigh}Ga_{1-xhigh}N$ doped with a p-type dopant and $Al_{xlow}Ga_{1-xlow}N$ doped with the p-type dopant, where $x_{low} \leq x_{high} \leq 0.9$. Each layer of the SPSL has a thickness of less than or equal to about six bi-layers of AlGaN.

20 Claims, 19 Drawing Sheets

(51) Int. Cl.
  *H01S 5/30* (2006.01)
  *H01S 5/34* (2006.01)

(56) References Cited

U.S. PATENT DOCUMENTS

| | | | |
|---|---|---|---|
| 2007/0181869 A1 | 8/2007 | Gaska et al. | |
| 2008/0054248 A1* | 3/2008 | Chua et al. | 257/14 |
| 2008/0191195 A1* | 8/2008 | Tanizawa et al. | 257/14 |
| 2009/0309127 A1* | 12/2009 | Raring et al. | 257/103 |
| 2010/0327293 A1* | 12/2010 | Hikita et al. | 257/76 |
| 2011/0064103 A1 | 3/2011 | Ohta et al. | |
| 2011/0140083 A1* | 6/2011 | Driscoll et al. | 257/15 |
| 2011/0168977 A1* | 7/2011 | Eichler et al. | 257/13 |
| 2011/0216797 A1* | 9/2011 | Watanabe et al. | 372/45.012 |
| 2012/0189030 A1* | 7/2012 | Miyoshi | 372/45.012 |
| 2012/0217473 A1 | 8/2012 | Shur et al. | |
| 2013/0099141 A1* | 4/2013 | Chua | 250/504 R |

OTHER PUBLICATIONS

Nakamura et al., "InGaN/GaN/AlGaN-based Laser Diodes with Modulation-doped Strained-layer Superlattices Grown on an Epitaxially Laterally Overgrown GaN Substrate", Appl. Phys. Lett. 72(2), Jan. 12, 1998, pp. 211-213.

Romanov et al., "Strain-Induced Polarization in Wurtzite III-Nitride Semipolar Layers", J. Appl. Phys. 100, 2006, 023522-1-023522-10.

Schubert et al., "Enhancement of Deep Acceptor Activation in Semiconductors by Superlattice Doping", Appl. Phys. Lett. 69, 1996, pp. 3737-3739.

"Good Grades for Reducing Nitride LED Efficiency Droop", Semiconductor Today, Jan. 13, 2011, 2 pages.

"Grading Barriers for Improved Hole Transport", Semiconductor Today, Nov. 26, 2011, 2 pages.

Simon et al., "Polarization-Induced Hole Doping in Wide-Band-Gap Uniaxial Semiconductor Heterostructures", Science, vol. 327, Jan. 1, 2010, pp. 60-64.

Simon, "Polarization-Engineered III-V Nitride Heterotstructure Devices by Molecular Beam Epitaxy", Apr. 2009, 140 pages.

Waldron et al., "Improved Mobilities and Resistivities in Modulation-Doped P-Type AlGaN/GaN Superlattices", Applied Physics Letters, vol. 79, No. 17, Oct. 22, 2001, pp. 2737-2739.

Wang et al., "Hole Injection and Efficiency Droop Improvement in InGaN/GaN Light-Emitting Diodes by Band-Engineered Electron Blocking Layer", Applied Physics Letters 97, 2010, 261103-1-261103-3.

Wang et al., "Hole Transport Improvement in InGaN/GaN Light-Emitting Diodes by Graded-Composition Multiple Quantum Barriers", Applied Physics Letters 99, 2011, 171106-1-171106-3.

Zhang et al., "Effect of the Graded Electron Blocking Layer on the Emission Properties of GaN-Based Green Light-Emitting Diodes", Applied Physics Letters, vol. 100, 2012, 053504-1-053504-3.

Kawaguchi et al., "Influence of polarity on carrier transport in semipolar (20) and (201) multiple-quantum-well light-emitting diodes," Appl. Phys. Lett. 100, 231110 (2012), 5 pages.

Notice of Allowance dated Jun. 23, 2015 for U.S. Appl. No. 13/619,687, 16 pages.

Request for Continued Examination dated May 29, 2015 for U.S. Appl. No. 13/619,687, 14 pages.

Response to Final Office Action dated Mar. 26, 2015 for U.S. Appl. No. 13/619,687, 16 pages.

Final Office Action dated Jan. 29, 2015 for U.S. Appl. No. 13/619,687, 21 pages.

Response to Non-Final Office Action dated Nov. 21, 2014 for U.S. Appl. No. 13/619,687, 12 pages.

Non-Final Office Action dated Jul. 24, 2014 for U.S. Appl. No. 13/619,687, 18 pages.

\* cited by examiner

| | z@d=0nm | z@d=50nm | z@d=100nm |
|---|---|---|---|
| LINEAR | 0.75 | 0.375 | 0 |
| PARABOLIC | 0.75 | 0.5 | 0 |

| | z@d=0nm | z@d=15nm | z@d=30nm | z@d=65nm | z@d=100nm |
|---|---|---|---|---|---|
| S | 0.75 | 0.71 | 0.62 | 0.2 | 0 |

WAIST

P-SIDE LAYERS FOR SHORT WAVELENGTH LIGHT EMITTERS

STATEMENT REGARDING FEDERALLY SPONSORED RESEARCH AND DEVELOPMENT

This invention was made with U.S. Government support through the Defense Advanced Research Projects Agency (DARPA) under Army Research Laboratory (ARL) Cooperative Agreement #W911NF-10-02-0102. The Government has certain rights in this invention.

SUMMARY

Various embodiments described herein involve light emitting devices comprising a p-side heterostructure that includes a short period superlattice (SPSL) having alternating layers of $Al_{xhigh}Ga_{1-xhigh}N$ doped with a p-type dopant and $Al_{xlow}Ga_{1-xlow}N$ doped with the p-type dopant, where $x_{low} \leq x_{high} \leq 0.9$. Each layer of the SPSL has a thickness of less than or equal to about six bi-layers of AlGaN. These light emitting devices include an n-side heterostructure and an active region configured to emit light disposed between the SPSL and the n-side heterostructure.

Some embodiments describe a light emitting device comprising a p-side heterostructure that includes a short period superlattice (SPSL) having alternating layers of $Al_{xhigh}Ga_{1-xhigh}N$ doped with a p-type dopant and $Al_{xlow}Ga_{1-xlow}N$ doped with the p-type dopant, where $x_{low} \leq x_{high} \leq 0.9$. The device includes an n-side heterostructure and an active region configured to emit light disposed between the SPSL and the n-side heterostructure. The alternating layers cause modulation in a valence band potential in the SPSL and the modulation is approximately equal to an acceptor level energy of the p-type dopant.

Some embodiments involve a light emitting device that includes a p-side heterostructure, an n-side heterostructure, and an active region configured to emit light that is disposed between the p-side heterostructure and the n-side heterostructure. The light emitting device also includes a metallic p-contact and a p-contact layer disposed between the p-side heterostructure and the p-contact. The p-contact layer comprises $Al_zGa_{1-z}N$ and having a thickness, D, where z has an S-shaped Al composition profile that varies over a substantial portion of the thickness of the p-contact layer. In some cases, the p-side heterostructure comprises a short period superlattice (SPSL) including alternating layers of $Al_{xhigh}Ga_{1-xhigh}N$ doped with a p-type dopant and $Al_{xlow}Ga_{1-xlow}N$ doped with a p-type dopant, where $x_{low} \leq x_{high} \leq 0.9$.

Some embodiments involve a light emitting device that includes a p-side heterostructure comprising a short period superlattice (SPSL), an n-side heterostructure; and an active region configured to emit light disposed between the SPSL and the n-side heterostructure. The SPSL comprises a first portion and a second portion, the first portion proximate the active region and comprising a first number of alternating layers of $Al_{x1high}Ga_{1-x1high}N$ and $Al_{x1low}Ga_{1-x1low}N$. The second portion comprises a second number of alternating layers of $Al_{x2high}Ga_{1-x2high}N$ and $Al_{x2low}Ga_{1-x2low}N$. A thickness of each layer of the SPSL has a thickness of less than or equal to about six bi-layers of AlGaN.

Methods of fabricating a light emitting device include growing an n-side heterostructure on a substrate, growing an active region on the n-side heterostructure, and growing a short period superlattice (SPSL) proximate to the active region. Growing the SPSL includes growing alternating layers of $Al_{xhigh}Ga_{1-xhigh}N$ doped with a p-type dopant and $Al_{xlow}Ga_{1-xlow}N$ doped with the p-type dopant, where $x_{low} \leq x_{high} \leq 0.9$ and each layer of the SPSL having a thickness of less than or equal to about six bi-layers of AlGaN.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

Like reference numbers refer to like components; and

Drawings are not necessarily to scale unless otherwise indicated.

DESCRIPTION

Light emitting diodes and laser diodes that produce ultraviolet (UV) light have been used in a wide variety of applications including water purification, disinfection, security, UV curing, phototherapy, and medical diagnostics. For example, UV light can be produced by larger bandgap semiconductor materials, such as III-nitride materials including AlN, AlGaN, InGaN, InAlGaN, and others. However, doping these materials to achieve high hole concentration is difficult because the activation energy of dopants in these larger bandgap materials is relatively high. Approaches described in this disclosure relate to polarization enhanced doping that increases the hole concentration in one or more layers of light emitting devices Polarization enhanced doping operates to increase the concentration of mobile carriers due to polarization fields that are present in the semiconductor layers. Polarization enhanced doping arises due to the electronegativities of atoms that create a dipole when two (or more) atoms having different electronegativities are chemically bonded in a compound. The dipole of the compound can result in polarization macroscopically across the layers in a crystal. The amount of polarization across the layers is influenced by the crystalline structure as well as the strain present in the crystalline lattice. III-nitride semiconductors grow crystals having wurtzite configuration, wherein the atomic crystal arrangement is such that a spontaneous polarization charge is present even under no applied strain.

The polarization of the crystal layers creates fixed charges at the interface between two layers of material with different polarization. Because the polarization charges are fixed, they do not themselves contribute to electrical transport in the crystal, however, the polarization charges can induce the creation of mobile carriers. The polarization charges are present when the polarization field within the crystal changes with distance. For example, a changing polarization field occurs across an interface of polar crystals. When fixed charges are present at the interface, the fixed charges are neutralized by mobile charges in the material. The amount of mobile charge that the polarization charges induce at the interface of two nitride layers is dependent on the composition and structure of the crystal. In the case of AlGaN, for example, the aluminum composition of the AlGaN at the junction determines the amount of polarization and thus the number of mobile charges induced at the interface. Note that polarization enhanced doping may be applied to carriers of either type. In nitride based light emitting devices, polarization enhanced doping is particularly relevant to enhancing hole concentration due to the difficulty of doping the nitride layers to achieve high p-type donor concentrations and simultaneously providing high conductivity layers.

Figure 1:
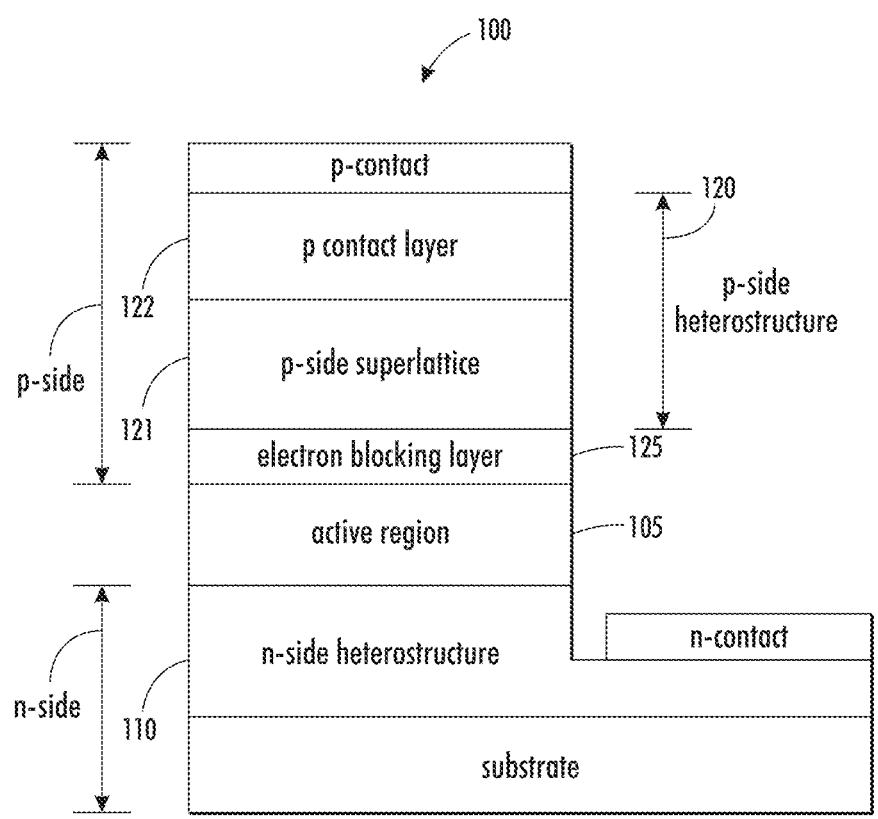
FIG. 1 depicts a cross sectional view of a light emitting device that may incorporate various optional layers that rely on polarization enhanced doping achieved by a varying Al composition in accordance with various embodiments.

FIG. 1 depicts a cross sectional view of a light emitting device 100 that may incorporate various optional layers that rely on polarization enhanced doping achieved by a varying Al composition. In the example shown in FIG. 1, the light emitting device 100 includes an active region 105 disposed between a p-side heterostructure 120 and an n-side heterostructure 110. For example, the p-side heterostructure 120 may comprises a p-side short period superlattice (SPSL) 121 comprising alternating layers of $Al_{xhigh}Ga_{1-xhigh}N/Al_{xlow}Ga_{1-xlow}N$, where $x_{high}$ can range from about 1 to about 0.5 and $x_{low}$ can range from about 0.75 to about 0, for example. P-contact layer 122 is disposed between the SPSL 121 and the p-contact, which may be a metal such as palladium (Pd). The p-contact layer 122 may comprise $Al_zGa_{1-z}N$ and may be graded according to an Al composition profile that decreases as a function of distance in a direction from the SPSL 121 towards the p-contact.

The layers of the n-side heterostructure 110, active region 105, and p-side heterostructure 120 can be epitaxially grown on a substrate comprising a hexagonal symmetry material, such as a group III-nitride material. Suitable materials for the substrate may comprise one or more of GaN, AlN, SiC, sapphire, Si, GaAs, ZnO, a group III-N alloy, and a template comprising a group III-N material.

In many cases, AlN provides a particularly suitable substrate for the AlGaN layers of the light emitting device because these AlGaN device layers have high Al content. Epitaxially growing high Al composition layers on AlN provides low mismatch between the substrate lattice and the lattice of the epitaxially grown layers. For example, the light emitting device may include a bulk AlN substrate, wherein the n-side heterostructure, active region, and p-side heterostructure are grown on the bulk AlN substrate. As an alternative to the bulk AlN substrate, an AlN template epitaxially grown on a substrate of sapphire or other material may be used.

The layers of the light emitting device 100 may be grown on a polar or semi-polar surface or facet of the substrate. In some embodiments, the substrate may comprise sapphire, a group-III nitride, SiC, or ZnO, wherein the n-side heterostructure, active region and p-side heterostructure are epitaxially grown on an (0001) or (0001) surface of the substrate. In some embodiments, the substrate may comprise a group-III nitride, SiC, or ZnO, wherein the n-side heterostructure, active region and p-side heterostructure are epitaxially grown on a semi-polar facet of the substrate.

The active region 105 may include one or more quantum wells that are separated by barriers and/or multiple quantum well structures that are separated by spacers. Electrons from the n-side of the device and holes from the p side of the device diffuse to the active region 105 where they can recombine to generate light. The quantum wells, barriers, and/or spacers may be formed using any nitride based material system, such as InGaN, AlGaN, InAlN, InAlGaN, or other nitrides, or polar oxides such as the BeMgZnO system. In some cases, an electron blocking layer (EBL) 125 is disposed between the last quantum well structure of the active 105 region and the p side heterostructure 120 to help contain electrons within the active region 105. Because light emission depends on recombination of holes and electrons in the active region 105, it is beneficial to retain electrons in the active region to increase the likelihood of recombination.

It can be difficult to achieve sufficiently high p-type conductivity together with sufficiently high optical transparency in the semiconducting material in the p-side heterostructure 120 situated between the metal p-contact and the active region 105 in a short wavelength ($\lambda$~250 nm) laser in the nitride system. For example, AlGaN used in the p-side layers 120 must be sufficiently conductive and at the same time sufficiently transparent at the lasing wavelength. Magnesium can be used as a p-type dopant for AlGaN, and because the energy of the Mg acceptor level in AlGaN increases with Al composition, it becomes more difficult to achieve high hole concentration and conductivity as the Al composition increases. Transparency, however, is more readily achieved in AlGaN when Al composition is large, and this places a competing constraint on Al composition in the p-side layers. Another constraint is the need to establish a good electrical contact between the nitride material and the metal electrode of the p-contact. This requirement is more readily satisfied by forming the contact between a metal and GaN (approximately zero Al composition).

Embodiments discussed herein involve designs for p-layer structures that simultaneously achieve sufficient p-type conductivity, sufficient optical transparency and enable the establishment of a low resistivity electrical contact between the p-type material and the metal electrode. The approaches discussed herein can involve an acceptor-doped $Al_{xhigh}Ga_{1-xhigh}N/Al_{xlow}Ga_{1-xlow}N$ SPSL 121 that can optionally be used in conjunction with a acceptor-doped graded AlGaN p-contact layer 122 that connects the SPSL 121 to a metal p-contact. A suitable acceptor for AlGaN comprises magnesium (Mg). Other possible p-type dopants for AlGaN include Be and C. The graded p-contact layer may comprise $Al_zGa_{1-z}N$ where z is graded according to a profile, which may be constant, linear, parabolic, and/or S-shaped, for example. Sufficiently low optical absorption losses, sufficiently high p-type conductivity, and a good electrical contact can be achieved with these approaches.

In some embodiments, the Al composition in the SPSL 121 alternates between a relatively high value ($x_{high}$~0.9) and a relatively low value ($x_{low}$~0.5). The thickness of the $Al_{xhigh}Ga_{1-xhigh}N$ layers is denoted herein as $T_{high}$ and the thickness of the $Al_{xlow}Ga_{1-xlow}N$ is denoted $T_{low}$. $T_{high}$ and $T_{low}$ can be in a range of about 0.7 nm to about 1.5 nm, for example, or less than about 6 bi-layers. The term "bi-layer" designates a pair of layers comprising one layer of group III atoms and one layer of N atoms. The layer of group III atoms comprises a mixture of Al and Ga atoms. Each bi-layer of AlGaN has a thickness of about 0.25 nm. The overall thickness of the SPSL 121 is subject to several constraints. According to one constraint, for an SPSL used as a cladding layer, it is desirable for the SPSL to be relatively thick to contain the optical mode. As a competing constraint, it is desirable for the SPSL to be relatively thin to decrease the electrical resistivity and increase the vertical current flow through the SPSL. As a competing constraint, it is desirable for the SPSL to be relatively thin to decrease the electrical resistivity and therefore allow high current flow through the SPSL with relatively less heating. To achieve these competing constraints, the total thickness of the SPSL may be greater than about 200 nm and less than about 450 nm, for example. The average Al composition in the SPSL 121 can be calculated $x_{ave}=(x_{high}T_{high}+x_{low}T_{low})/(T_{high}+T_{low})$. The average Al composition must be sufficiently high to prevent significant absorption of the light generated in the device. For example, for $\lambda$ equal to about 290 nm, an average Al composition can be in a range of greater than about 45% and less than about 80%. For $\lambda$ greater than about 330 nm, an average Al composition can be in a range of greater than about 30% and less than about 80%.

If the SPSL is used as a cladding layer in a laser diode, it can be helpful to push the optical mode away from the p-side of the device, which can be achieved using a relatively high average Al composition, e.g., greater than about 60% for $\lambda$=290 nm. The use of higher Al composition in the p-cladding of the laser diode may appear to be counterintuitive because resistivity of the p-cladding layer increases with Al composition. However, as a competing constraint, the high Al composition can operate to push the optical mode to the n-side of the device and thus reduce optical loss.

Figure 2:
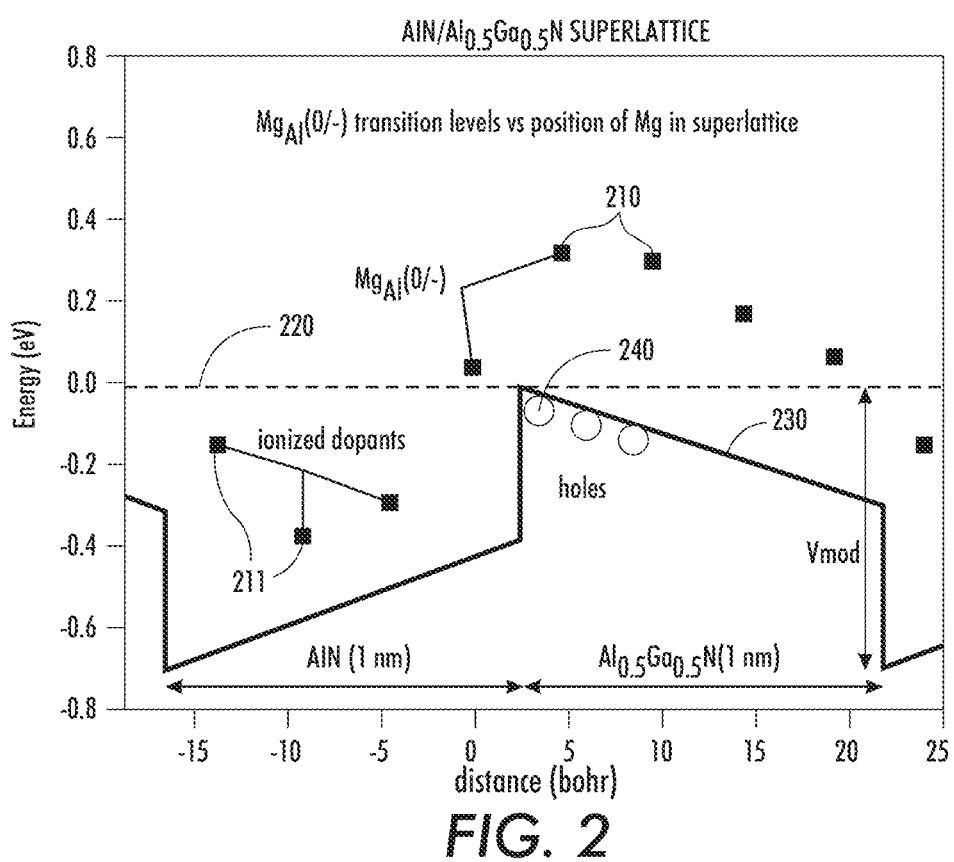
FIG. 2 shows calculated transition levels for Mg atoms in a short period superlattice (SPSL) that exhibits polarization enhanced doping.

FIG. 2 illustrates polarization enhanced doping in an SPSL. For devices comprising an AlGaN SPSL grown on c-plane substrates, the c-axis of the AlGaN is perpendicular to the plane of the layers. In such a SPSL there will be a large discontinuity in the polarization at each interface. The magnitude of the discontinuity depends on the strain in the layers, and on the change in the composition at the interface. This discontinuity in the polarization gives rise to an electric field in each layer, which, together with the valence band offset between $Al_{xhigh}Ga_{1-xhigh}N$ layers, e.g., AlN in FIG. 2 and the $Al_{xlow}Ga_{1-xlow}N$ layers, e.g., $Al_{0.5}Ga_{0.5}N$ in FIG. 2, gives rise to a modulation of the potential within the crystal. The modulation of the potential leads to the ionization of p-type dopants and the formation of holes. P-type dopants (such as Mg atoms) that are located in layers with high Al composition are likely to become ionized by capturing an electron. The electron is removed from the layers with lower Al composition, and this creates a hole. The holes tend to accumulate at an interface between the layers as indicated schematically in FIG. 2.

FIG. 2 shows calculated transition levels 210, 211 for Mg atoms. The dashed line represents the calculated Fermi energy 220 and the solid line represents the valence band maximum 230 of the SPSL. When the transition level 211 for a given Mg atom is below the Fermi energy 220, that Mg atom will likely be ionized and in a negatively charged state. Mg atoms located in the Al-rich part of the SPSL have transition levels 211 that are below the valence band maximum 230 of the SPSL structure. These Mg atoms will likely become negatively charged and this gives rise to holes 240. The Mg atoms located in regions having less Al have transition levels 210 that are above the Fermi energy 220. These Mg atoms are likely to remain in the neutral charge state.

The SPSL gives rise to a modulation in the valence band edge. The modulation of the valence band edge in a short period SPSL, defined as $V_{mod}$, is approximately equal to the sum of the valence band offset (VBO) between the two materials in the SPSL and the change in potential in the SPSL arising from the polarization charges at the interfaces. For the AlGaN system we can estimate the valence band offset (VBO) as follows. The VBO between $Al_{xhigh}Ga_{1-xhigh}N$ and $Al_{xlow}Ga_{1-xlow}N$ is approximately equal to:

$$VBO=0.3\{E_{gap}(Al_{xhigh}Ga_{1-xhigh}N)-E_{gap}(Al_{xlow}Ga_{1-xlow}N)\}.$$

where $E_{gap}$ is the energy gap between the valance band and the conduction band. Approximately 30% of the difference in the band gaps contributes to an offset in the valence bands and the remaining 70% contributes to an offset in the conduction bands. Combining this with $E_{gap}(Al_{xhigh}Ga_{1-xhigh}N)$=xhigh $E_{gap}(AlN)+(1-xhigh)E_{gap}(GaN)-b\ xhigh(1-xhigh)$, we may obtain an estimate for VBO as a function of the xhigh and xlow for the two materials. We employ $E_{gap}(AlN)=6.2$ eV, $E_{gap}(GaN)=3.4$ eV, and b=0.7 eV to obtain VBO.

The electric fields $E_{xhigh}$ and $E_{xlow}$ in the superlattice composed of alternating layers of $Al_{xhigh}Ga_{1-xhigh}N$ and $Al_{xlow}Ga_{1-xlow}N$ with thicknesses $T_{high}$ and $T_{low}$ may be written as $$E_{xhigh}=T_{low}(P_{xlow}-P_{xhigh})/(T_{high}\in_{xlow}+T_{low}\in_{xhigh}),$$

$$E_{xlow}=T_{high}(P_{xhigh}-P_{xlow})/(T_{high}\in_{xlow}+T_{low}\in_{xhigh})$$

Figure 3:
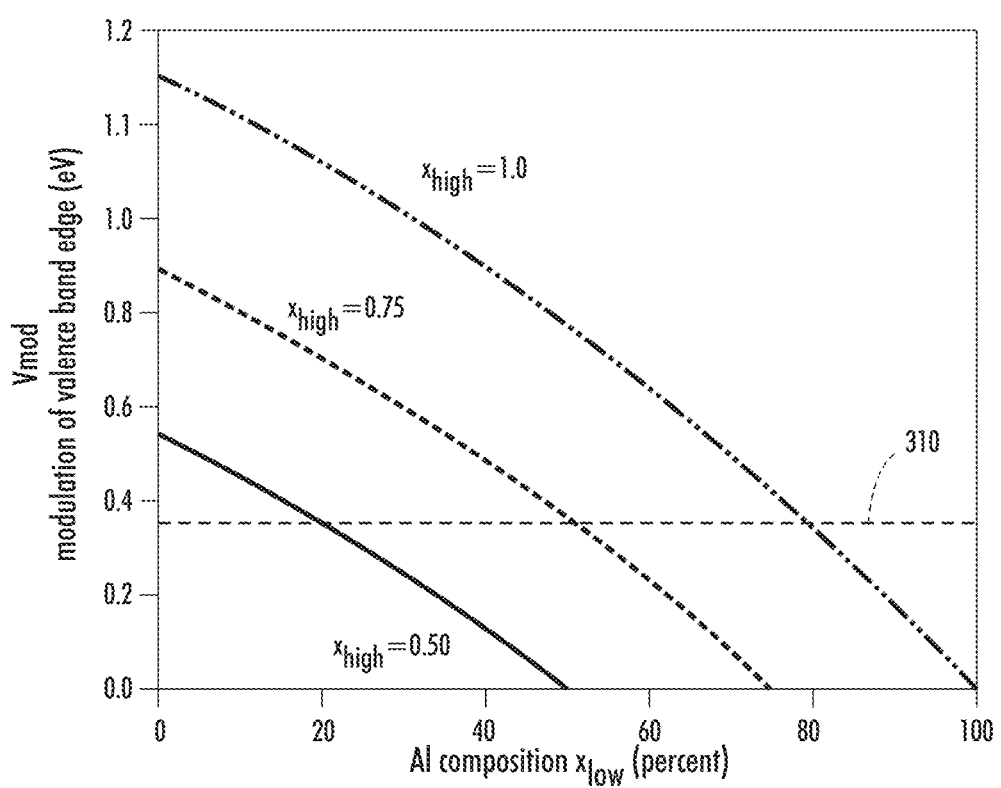
FIG. 3 is a family of graphs that show the total modulation of the valence band edge ($V_{mod}$) plotted as a function of $x_{low}$ for a fixed $x_{high}$.

In these expressions $P_{xlow}$ and $P_{xhigh}$ are the polarizations in the $Al_{xlow}Ga_{1-xlow}N$ and the $Al_{xhigh}Ga_{1-xhigh}N$ and $\in_{xhigh}$ and $\in_{xlow}$ are the dielectric constants of the two materials. The change in potential across the SPSL segment of thickness $T_{high}$ is $T_{high}\ E_{xhigh}$ and the change in potential across the superlattice segment of thickness $T_{low}$ is $T_{low}\ E_{xlow}$. Note that $T_{high}\ E_{xhigh}=-T_{low}\ E_{xlow}$. The total modulation of the valence band edge ($V_{mod}$) is the sum of the contributions arising from the band offset and the polarization fields. $V_{mod}$ is plotted in FIG. 3 as a function of $x_{low}$ for a fixed $x_{high}$. For the simulation of FIG. 3, $T_{high}$ and $T_{low}$ are each equal to one nanometer.

In many cases, the SPSL has a total modulation in the valence band potential that is comparable (e.g., about equal) to the energy of the acceptor level of the p-type dopant. For the AlGaN system the most common acceptor is Mg and the energy of the acceptor level in $Al_{0.5}Ga_{0.5}N$ is approximately 0.35 eV above the valence band maximum, as shown by the dashed line 310 in FIG. 3. When the modulation of the valence band produced by the SPSL is sufficiently large, the number of ionized acceptors is significantly enhanced in comparison to a homogeneous layer. This requirement places a constraint on the Al compositions in the SPSL. Specifically the difference between $x_{high}$ and $x_{low}$ should be greater than about 0.25 in order to achieve a significant benefit from the polarization enhanced approach. This is seen in the FIG. 3, where the total modulation in the potential as a function of $x_{low}$ is shown for $x_{high}$ set equal to 0.5, 0.75, or 1.0. If we choose $x_{high}$ to be 0.75 then we choose $x_{low}$ to be less than about 0.5. Performing the same estimation for $T_{high}=T_{low}=0.75$ nm leads to a similar conclusion. Thus, a possible embodiment of an effective $Al_{xhigh}Ga_{1-xhigh}N/Al_{xlow}Ga_{1-xlow}N$ SPSL approach is one where $T_{high}$ and $T_{low}$ are each less than or equal to one nanometer, and $x_{high}-x_{low}$ is greater than about 0.25.

The device illustrated in FIG. 1 can be grown in a polar orientation on the group-III face (0001) of the III-N material, e.g., the Al face of an AlN substrate. It is also possible to exploit polarization enhanced doping in devices grown on a semi-polar facet of the substrate. For semi-polar orientations, however, the change in polarization at the interfaces is reduced, and so the electric fields in the layers are reduced in comparison to c-plane interfaces. Thus, the enhancement of hole concentration is expected to be reduced in devices grown in semi-polar orientations as compared with devices grown in polar orientations.

Figure 4:
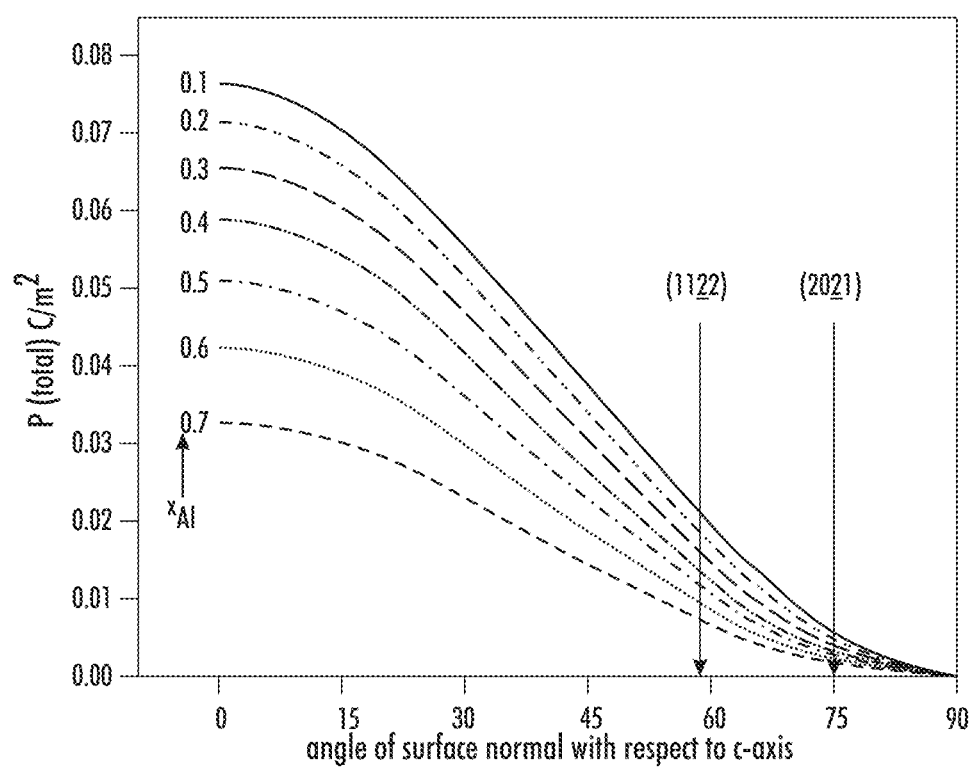
FIG. 4 shows the total polarization of compressively strained AlGaN on relaxed AlN with respect to the angle between the surface normal and the c-axis.

FIG. 4 shows the total polarization of compressively strained AlGaN on relaxed AlN with respect the angle between the surface normal and the c-axis. The total polarization is dependent on both the spontaneous polarization of the material and the piezoelectric polarization which arises from compressive strain in the AlGaN layer and unstrained The total polarization $\Delta P_{total}$ of c-plane compressively strained GaN on bulk AlN is approximately 0.08 C/m². For a c-axis oriented interface between $Al_{0.5}Ga_{0.5}N$ and AlN the discontinuity in the polarization is approximately 0.05 C/m².

The polarization discontinuity would be reduced if a semi-polar surface orientation such as (11$\bar{2}$2) is employed.

As previously discussed in connection with FIG. 2, a possible SPSL design that exploits polarization enhanced doping includes alternating 1 nm layers of $Al_{0.5}Ga_{0.5}N$ and AlN. One nanometer of material corresponds to about 4 (0001) layers of AlN. For a superlattice having these specifications, the total potential modulation, indicated by arrow 230 in FIG. 2, is about 0.7 eV. Based on the calculations discussed in connection with FIG. 2, a substantial fraction of Mg atoms present in the superlattice will be ionized.

An SPSL comprising 1 nm layers of $AlN/Al_{0.5}Ga_{0.5}N$ illustrates one configuration, note that other layer thicknesses and compositions can also be useful. For example, to increase the modulation, a larger contrast in Al composition may be useful. For example, a lattice that includes alternating layers of $Al_{0.25}Ga_{0.75}N$ and AlN (75% contrast) would provide additional contrast when compared to the $Al_{0.5}Ga_{0.5}N/AlN$ embodiment. The amount of contrast may be constrained by a maximum Al composition and a minimum Al composition. For example, it becomes more difficult to incorporate the p-type dopant into a layer that has a very high Al content, e.g., above 0.9. Furthermore, lower Al compositions, e.g., less than about 0.25 absorb more of the light generated by the device. Optimal Al compositions for the superlattice structures take into account all the constraints including difficulty of doping high Al composition AlGaN, absorption of light at lower Al compositions, and sufficient contrast to achieve modulation for polarization enhanced doping. In some implementations, optimal Al compositions for the layers of the polarization enhanced SPSL may alternate from $x_{high}$ less than about 0.9 to $x_{low}$ greater than about 0.44.

The thicknesses of the AlGaN layers in the polarization enhanced SPSL must be sufficiently small so that vertical transport of holes perpendicular to the layers is possible. The band gap of bulk $Al_xGa_{1-x}N$ for x less than about 0.5 is too low to prevent absorption of light at wavelengths less than or equal to 250 nm. However, quantum confinement in the SPSL increases the energy gap of the SPSL so that absorption of light in an SPSL having alternating layers $AlN/Al_{0.5}Ga_{0.5}N/$ or $Al_{xhigh}Ga_{1-xhigh}N/Al_{xlow}Ga_{1-xlow}N$ with average Al composition of greater than about 0.60, e.g., $Al_{0.74}Ga_{0.26}N/Al_{0.44}Ga_{0.56}N$, would be acceptably low. This type of SPSL is therefore appropriate for a laser emitting at around 250 nm.

Figure 5:
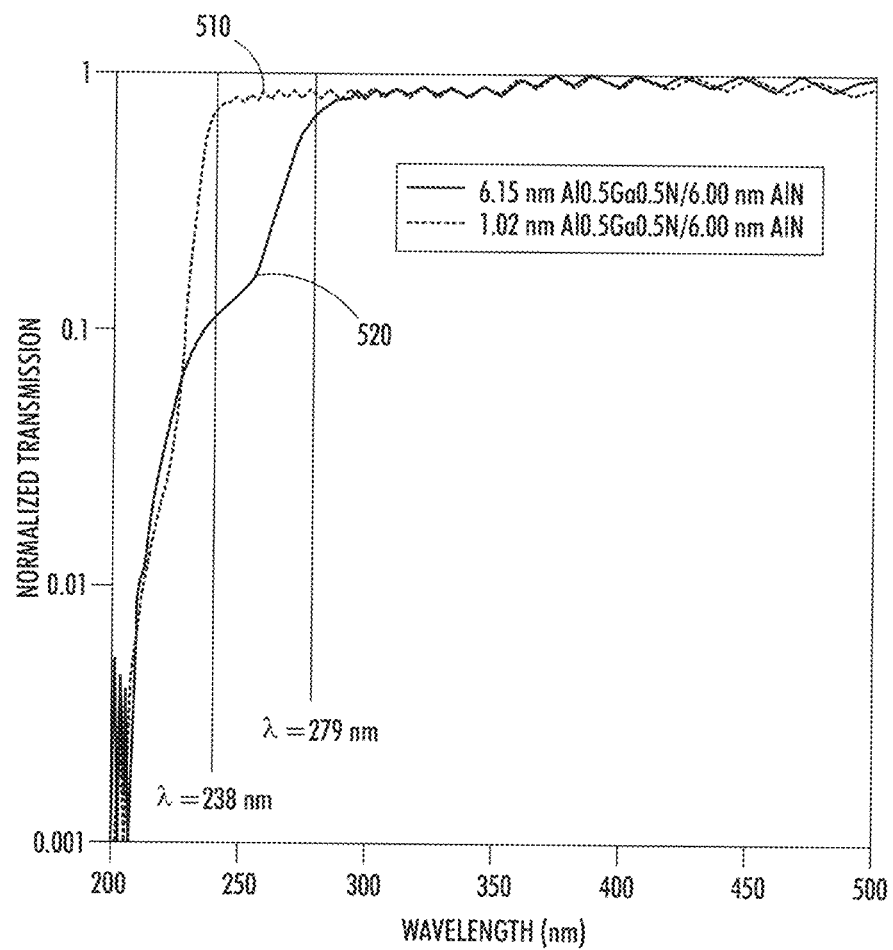
FIG. 5 shows the optical transmission spectra of SPSLs having layers of several thicknesses.

FIG. 5 is a graph that shows the optical transmission spectra of a p-side SPSL hole transport layer comprising 1.02 nm layers of $Al_{0.5}Ga_{0.5}N$ alternating with 1.45 nm layers of AlN (shown in graph 510) and a similar superlattice with thicker AlGaN/AlN layers (6.15 nm layers of $Al_{0.5}Ga_{0.5}N$ alternating with 6 nm layers of AlN) (shown in graph 520). The sample with thicker AlGaN layers shows a transmission dip at around λ=279 nm, corresponding to the band edge absorption of the AlGaN component of the superlattice. When the superlattice layers are made thinner according to the design discussed in connection with FIG. 2, the absorption edge moved to λ=238 nm, indicating that the hole transport layer has the desired property of low absorption at the design wavelength of λ=250 nm. Comparison of these spectra 510, 520 illustrates the enhanced optical transmission for the SPSL having thinner layers.

Figure 6:
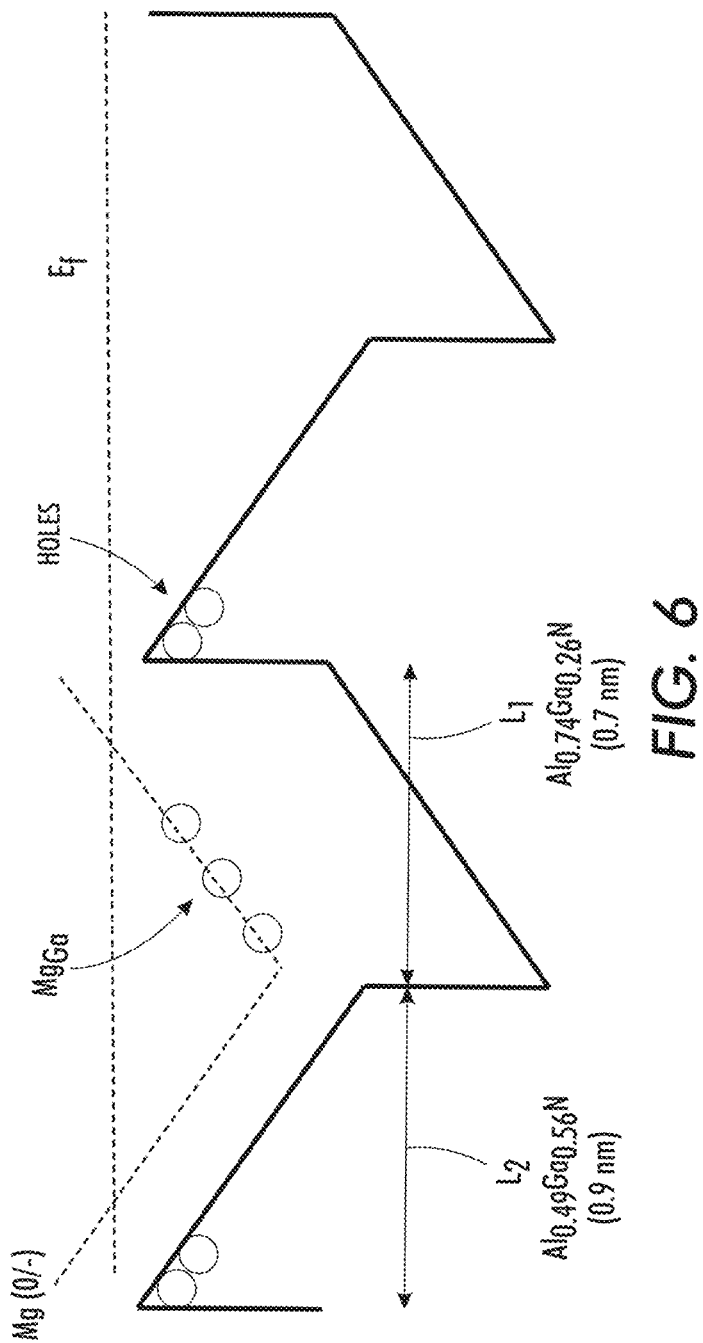
FIG. 6 shows the calculated band structure of an Mg doped $Al_{0.74}Ga_{0.26}N/Al_{0.49}Ga_{0.51}N$ SPSL, where $T_{high}$ is 0.7 nm and $T_{low}$ is 0.9 nm.

The thicknesses, $T_{high}$, and $T_{low}$, of individual layers of an $Al_{xhigh}/Ga_{1-xhigh}N/Al_{xlow}Ga_{1-xlow}/N$ within the SPSL may be only a few (e.g., 6) atomic bi-layers thick, as previously discussed. The high polarization fields within the SPSL promotes ionization of dopants, leading to improved hole generation and to lower electrical conductivity. FIG. 6 shows the calculated band structure of an Mg doped $Al_{0.74}Ga_{0.26}N/Al_{0.49}Ga_{0.51}N$ SPSL, where $T_{high}$ is 0.7 nm and $T_{low}$ is 0.9 nm.

Figure 7:
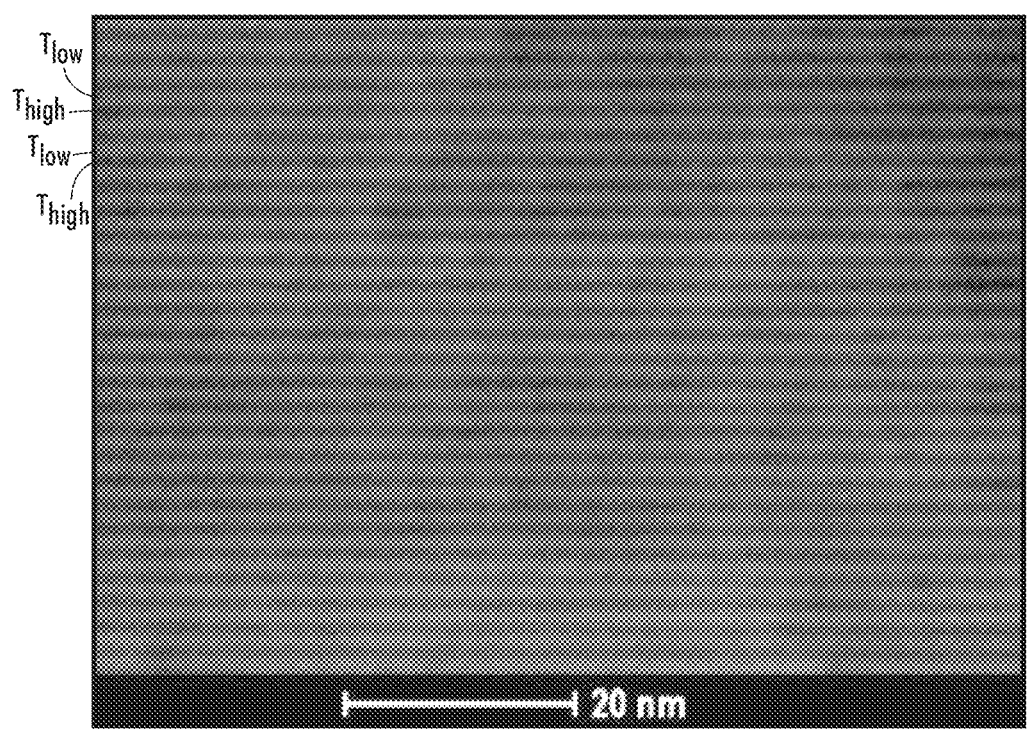
FIG. 7 is an electron microscope image of a cross section of an AlGaN/AlGaN SPSL having alternating $T_{high}$ and $T_{low}$ layers of about 1 nm each.

The energy levels of the Mg donors below the Fermi level, $E_f$, within the L1 region imply that Mg atoms within the L1 region of the SPSL can be ionized by the polarization fields. The resulting holes are then free to migrate to the lower energy wells within the adjacent L2 regions. Since the SPSL layers are very thin, vertical hole transport can be supported by tunneling. FIG. 7 is a cross section transmission electron micrograph (TEM) showing the SPSL structures that maintain sharp interfaces between the thin layers having thicknesses $T_{high}$ and $T_{low}$ of less about 1 nm.

The AlGaN/AlGaN SPSL shown in FIG. 7 was grown using metal organic chemical vapor deposition (MOCVD). Processes disclosed herein include heterostructure crystal growth conditions that enable sharp interfaces to be formed between such ultra-thin layers. It can be challenging to grow these SPSLs that vary the Al composition across thin layers with sharp interfaces because if appropriate growth conditions are not maintained, the very thin layers can merge into one alloy. For example, in some cases, growing the SPSL layers at temperatures of about 930 to 980° C. and pressure of about 200 torr allows for optimal crystal quality and incorporation of Mg dopants.

Growing the layers at a fairly slow growth rate can be used to achieve crystal quality and Mg incorporation. In one example, layers are grown at a rate of 0.01 to 0.04 nm per sec, corresponding to a metal organic Trimethylgallium (TMG) flow rate of 0.5 sccm and to an ammonia flow rate of 4 liters per minute. The high ammonia flow rate relative to TMG leads to a high V-III partial pressure, which can provide high crystal quality.

In general, the layers can be grown under relatively low ambient pressures of between about 80 torr up to about 700 torr and at a relatively low temperature between about 750° C. and about 1300° C. The selected growth temperature needs to achieve acceptable crystal quality, acceptor donor incorporation, and relatively sharp features between the layers of the SPSL.

Polarization-assisted hole-doped SPSL designs disclosed herein can support high levels of vertical current injection. The average Al composition in the superlattice depends on the wavelength of the emitted light. Total thickness as well as individual layer thickness of the SPSL in the device are chosen to reduce electrical resistance and allow hole transport by tunneling. We successfully injected pulsed currents with peak current densities of up to 21 kA/cm² through the devices. The devices also displayed reasonable voltages and handled DC current densities of as high as 11 kA/cm². These SPSL designs were incorporated into different laser diode heterostructures that were processed into two types of testable laser structures. The test geometry schematically shown in FIG. 8 was used for testing the electrical resistivity of the SPSLs as a function of temperature. Test structures schematically shown in FIG. 10 were used to test the current-voltage (IV) characteristics of the SPSLs.

Figure 8:
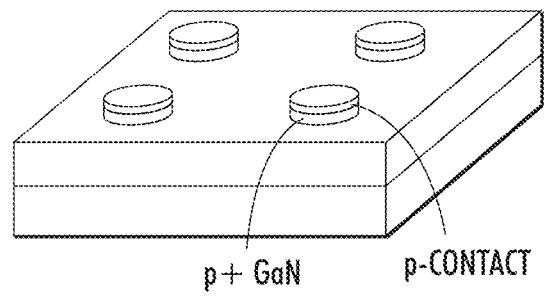
FIG. 8 is a diagram that illustrates the test geometry used for testing the electrical resistivity of the SPSLs as a function of temperature.

Turning now to tests of electrical resisitivity as a function of temperature, FIG. 8 shows the test geometry used for temperature testing of the SPSLs. Test devices were fabricated by forming Pd p-contacts on the p-contact layer (p+ GaN layer) and etching away the p+GaN layer material at regions between the contacts. The pattern of the p-contacts is processed into Van Der Pauw pattern for resistivity measurement.

Figure 9:
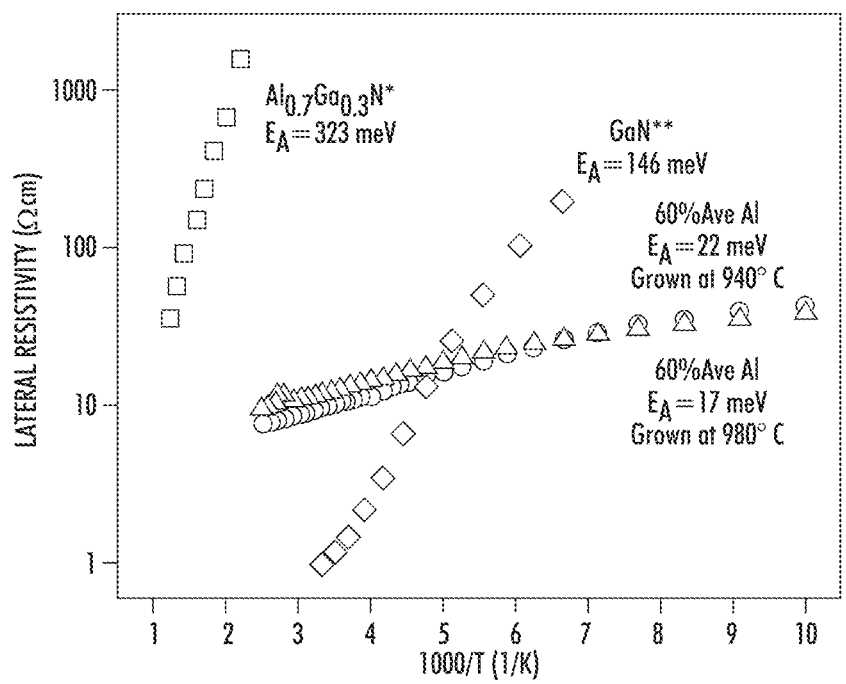
FIG. 9 shows SPSL resistivities as a function of temperature for two different test SPSL heterostructures.

FIG. 9 shows SPSL resistivities as a function of temperature for two different test SPSL heterostructures. Both designs have $x_{high}$=74%, $T_{high}$=0.7 nm and $x_{low}$=49%, $T_{low}$=0.9 nm-thick which is the layer combination indicated in FIG. 6. The corresponding average aluminum composition is 60% for both SPSLs is, and they both behave optically like 60% AlGaN. One structure was grown at a temperature of 940° C., while the other structure was grown at 980° C. FIG. 9 shows that the lateral electrical resistivities of these test SPSLs have nearly a-thermal behaviors, wherein the lateral resistivity changes by less than about 50 Ω-cm over a temperature range of 400 K to 100 K. The sample grown at 940° C. and the sample grown at 980° C. show similar behaviors. This weak temperature dependence suggests that the doping ionization mechanism is indeed a-thermal, which would be expected in the polarization-induced hole activation process previously described.

For comparison, FIG. 9 also plots the resistivity behavior of p-doped GaN and homogeneous p-doped $Al_{0.7}Ga_{0.3}N$. Both the p-GaN and the homogeneous p-AlGaN exhibit sharp increases in electrical resistivities with reduced temperatures as is characteristic of thermal hole activation. The thermal activation energy of the SPSL samples are 22 meV and 17 meV for the 940° C. and the 980° C. samples, respectively. In comparison, the activation energies are 323 meV for the homogeneous p-AlGaN and 146 meV for the p-GaN. Additionally, the AlGaN polarization enhanced SPSL designs described herein produce low resistivity of about 20 Ω-cm at temperatures less than about 175 K and/or about 10 Ω-cm at room temperature.

Figure 10:
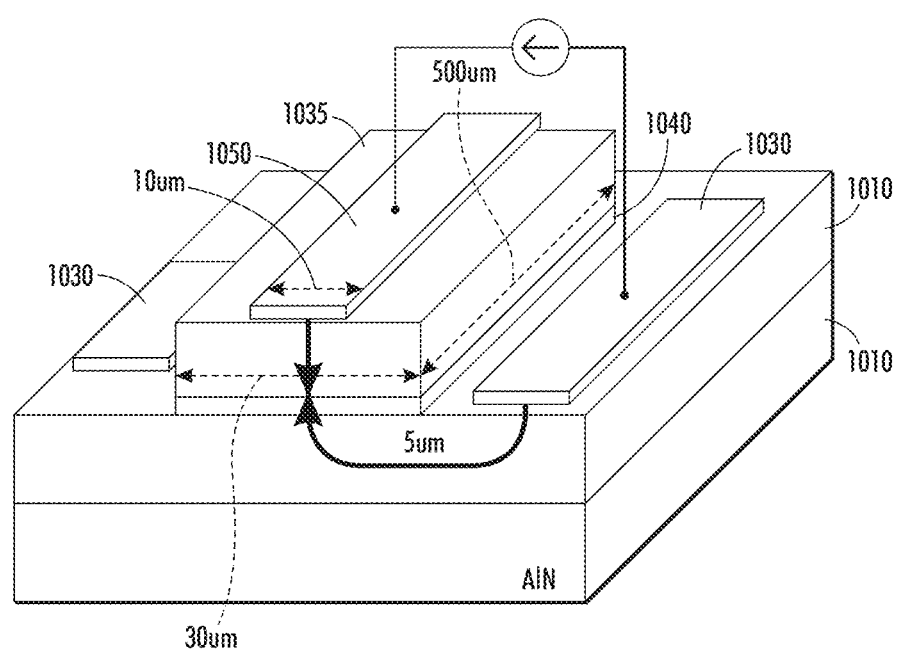
FIG. 10 is a schematic diagram of test structures used to test the current-voltage (IV) characteristics of light emitting devices that include the polarization enhanced SPSLs as discussed herein.
Figure 11:
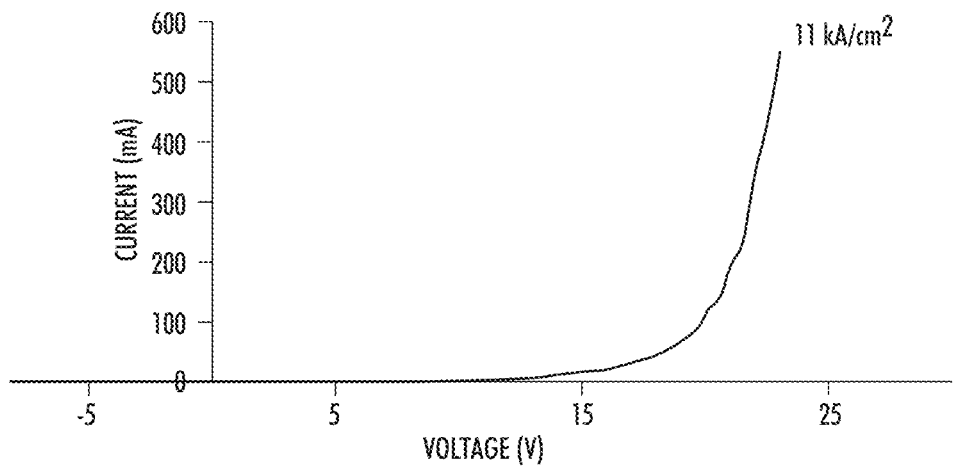
FIG. 11 shows the DC current-voltage (IV) characteristics of devices utilizing the polarization enhanced SPSL.
Figure 12:
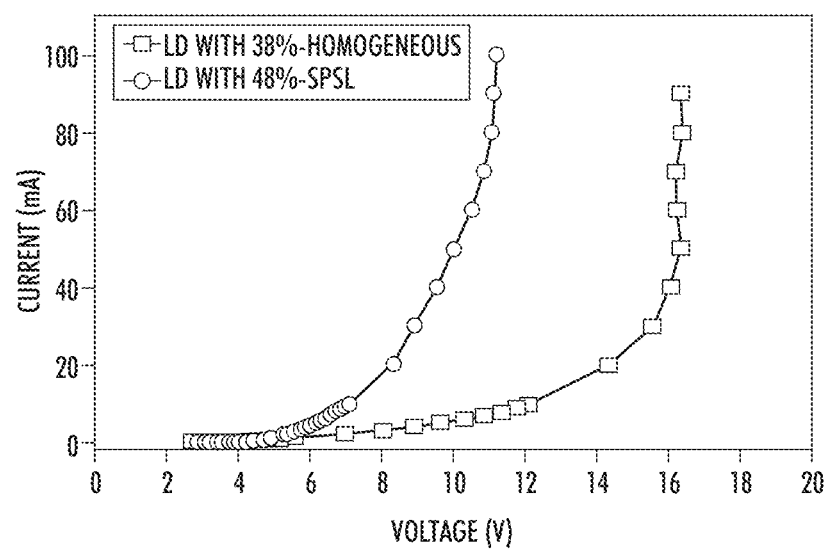
FIG. 12 compares the IV characteristic of a device utilizing a 48% average Al composition polarization enhanced SPSL with the IV characteristic of a device utilizing a conventional homogeneous AlGaN p-cladding layer having an Al composition of 38%.

FIG. 10 shows a three dimensional schematic view of the test structure used for IV testing of the SPSL structures. The test structure 1000 is a light emitting device that includes an AlN substrate 1010 with n-side heterostructure 1020, active region 1040, and p-side heterostructure 1035 (that includes the polarization enhanced SPSL) grown in that order on the AlN substrate 1010. A metallic n-contact 1030 makes electrical contact to the n-side heterostructure and a metallic p-contact 1050 makes electrical contact with the p-side heterostructure. FIG. 11 shows the DC current-voltage (IV) characteristics of devices utilizing the polarization enhanced SPSL. The results indicate successful vertical current injection through the device as the very thin layers of the polarization enhanced SPSL can achieve DC current densities of about J=11 kA/cm². FIG. 12 compares the IV characteristic of a device utilizing a 48% average Al composition polarization enhanced SPSL with the IV characteristic of a device utilizing a conventional homogeneous AlGaN p-cladding having an Al composition of 38%.

Referring back to FIG. 1, a graded p-contact layer 122 may be used alone or in conjunction with the polarization enhanced SPSLs described above. The graded p-contact layer has higher Al composition at the interface between the p-heterostructure and the p-contact layer and a lower Al composition at the interface between the p-contact layer and the p-contact. In some cases, the Al composition decreases linearly or piece-wise linearly across the p-contact layer, although other profiles are also useful, as discussed herein.

Figure 13:
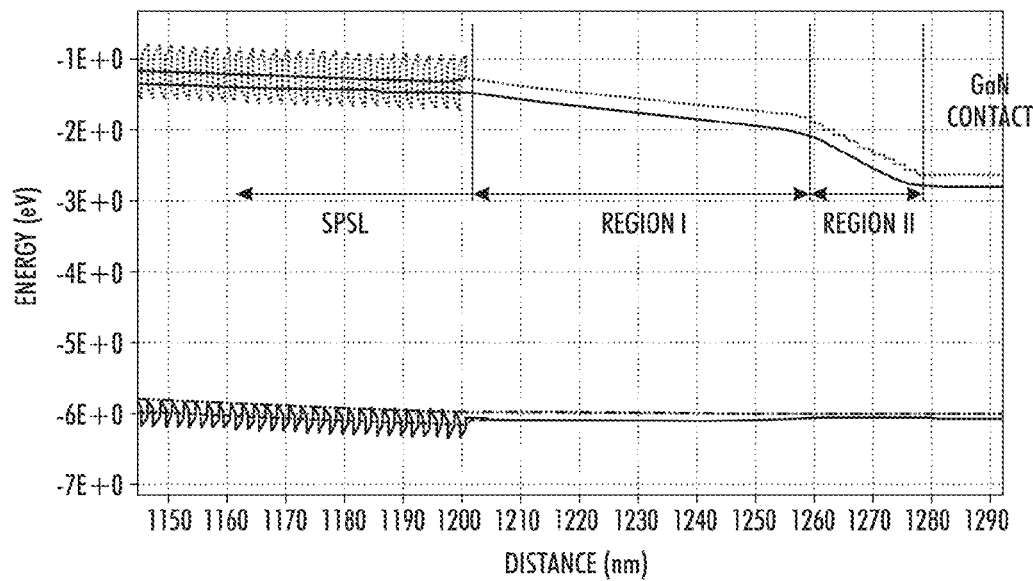
FIG. 13 shows a simulation of the band structure for a device containing both a polarization enhanced SPSL and a piece-wise linearly graded $Al_zGa_{1-z}N$ p-contact layer.
Figure 14:
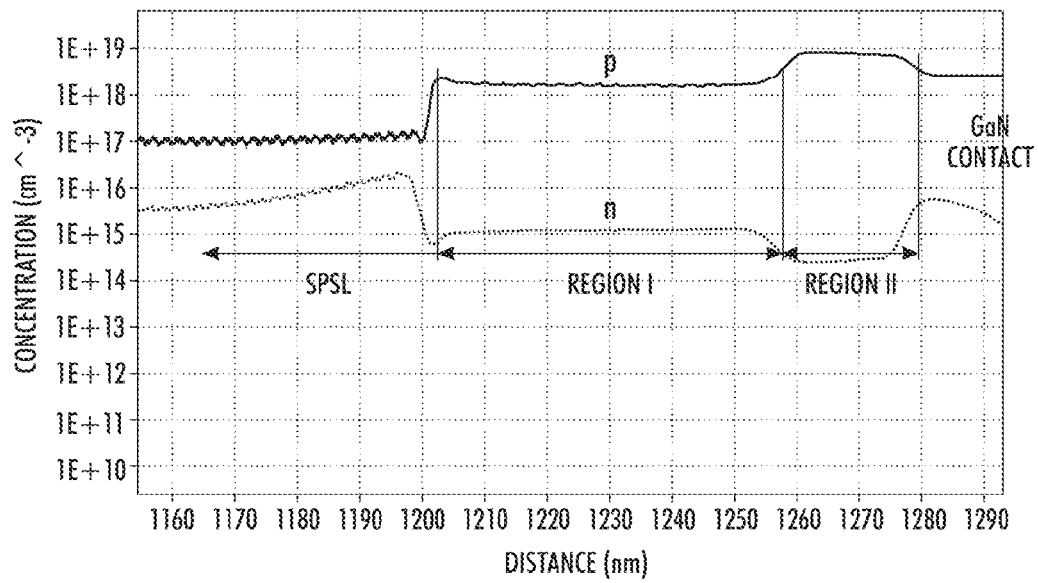
FIG. 14 shows the carrier concentration in each of the two graded regions of the p-contact layer.

A simulation of the band structure for a device containing both a polarization enhanced SPSL and a graded $Al_zGa_{1-z}N$ p-contact layer is shown in FIG. 13. In this device, the Al composition is graded from the average composition of the superlattice ($z=x_{ave}=0.59$) at the polarization enhanced SPSL down to $z=0$ at the p-contact. In this particular device, the grading is piecewise linear in two regions as shown in FIG. 13. The grading takes place in two steps: from z=0.59 to z=0.41 over a distance of 63 nm (Region I) and from z=0.41 to z=0 over a distance of 20 nm (Region II). As seen in FIG. 14, the hole concentration in each of the two graded regions of the p-contact layer is enhanced relative to the hole concentration in the SPSL. This approach allows for the optical absorption in Region I to be very low because the energy band gap of the $Al_zGa_{1-z}N$ in Region I is greater than the energy of the light emitted from the active region. Region I does not therefore contribute to the optical loss. By inclusion of a sufficiently thick Region I, it is possible to reduce the overlap of the optical mode with the absorbing GaN contact and thereby reduce optical loss. By employing a graded Region I the thickness of the SPSL can be reduced.

Grading the Al composition in the p-contact region produces a three-dimensional hole gas that extends over a region of thickness D, where D can be the thickness of the p-contact (if the grading is done across the entire layer, or other thickness across which the grading occurs. For example, the Al composition of $Al_zGa_{1-z}N$ in the p-contact layer may be graded linearly from z=0 at the interface between the p-contact layer and the p-contact to z=ΔzAl at the interface between the p-contact and the SPSL. In a linear approximation, the hole concentration h in such a region is given approximately by:

$$h = \Delta Ptotal \Delta zAl/D \quad [1]$$

In this expression ΔPtotal is the change in the total polarization at an interface between AlN and GaN, ΔzAl represents the change in the Al composition across the thickness of the p-contact layer, D. For compressively strained GaN on bulk AlN ΔPtotal=0.08 $C/m^2$. The hole density h in the graded layer will be approximately $3 \times 10^{18}$ $cm^{-3}$ for d=100 nm and ΔzAl=0.7. This hole concentration is sufficient to achieve acceptable conductivity in this region. Higher concentrations can be obtained by employing a smaller value of D.

Figure 15:
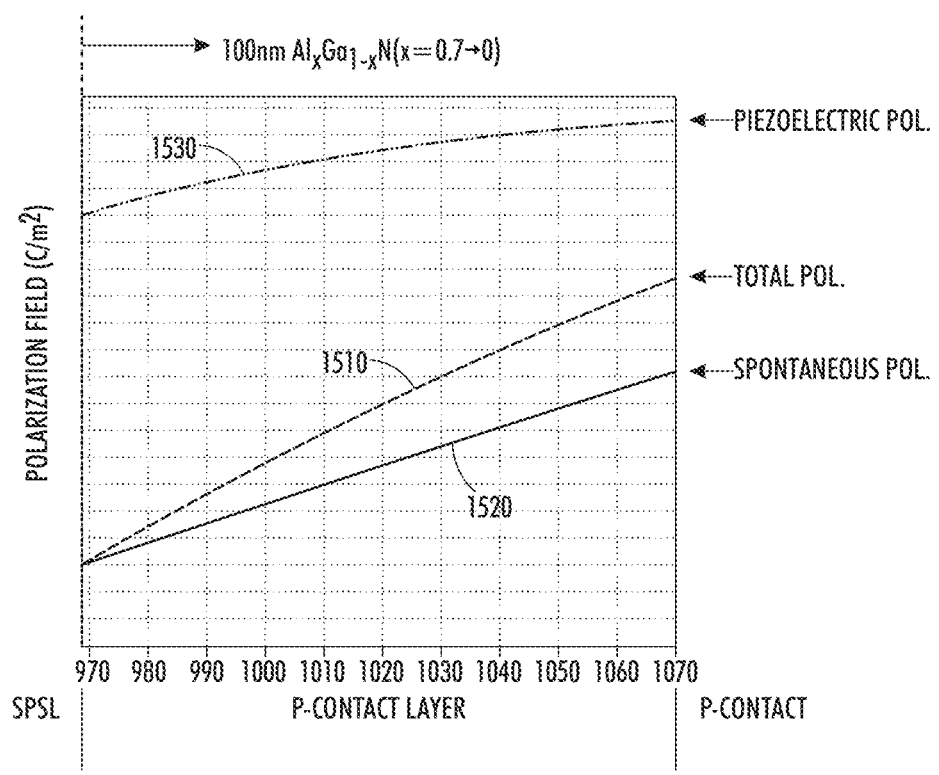
FIG. 15 shows polarization fields in Coulombs per meter squared (C/m2) for a linearly graded AlzGa1-zN p-contact layer with respect to distance.
Figure 16:
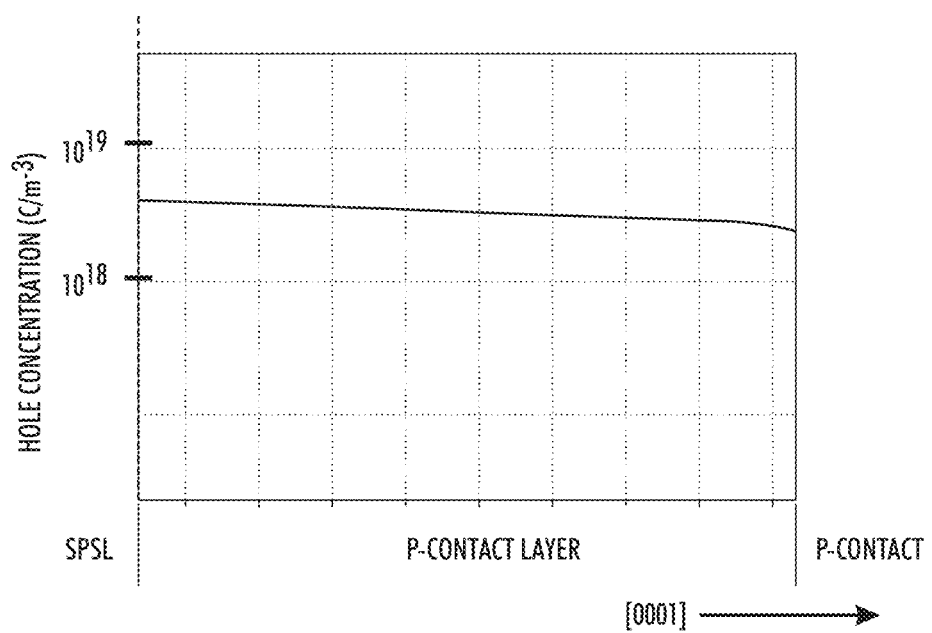
FIG. 16 shows the hole concentration in the linearly graded $Al_zGa_{1-z}N$ p-contact layer with respect to distance.

FIG. 15 shows polarization fields in Coulombs per meter squared ($C/m^2$) for a linearly graded $Al_zGa_{1-z}N$ p-contact layer with respect to distance. FIG. 16 shows the hole concentration in the $Al_zGa_{1-z}N$ p-contact layer with respect to distance for the linearly graded design. For the designs shown in FIGS. 15 and 16, the thickness of the p-contact layer, D, is 100 nm and z changes from 0.7 to 0. The total polarization 1510 is dependent on the spontaneous polarization 1520 and piezoelectric polarization 1530, which arises from strain in the layer.

As indicated in FIG. 16, the hole concentration is substantially uniform across the 100 nm layer. The polarization field of the graded layer creates a nearly uniform hole gas and therefore enhances conductivity in the vertical direction (the [0001] direction) through the device.

Figure 17:
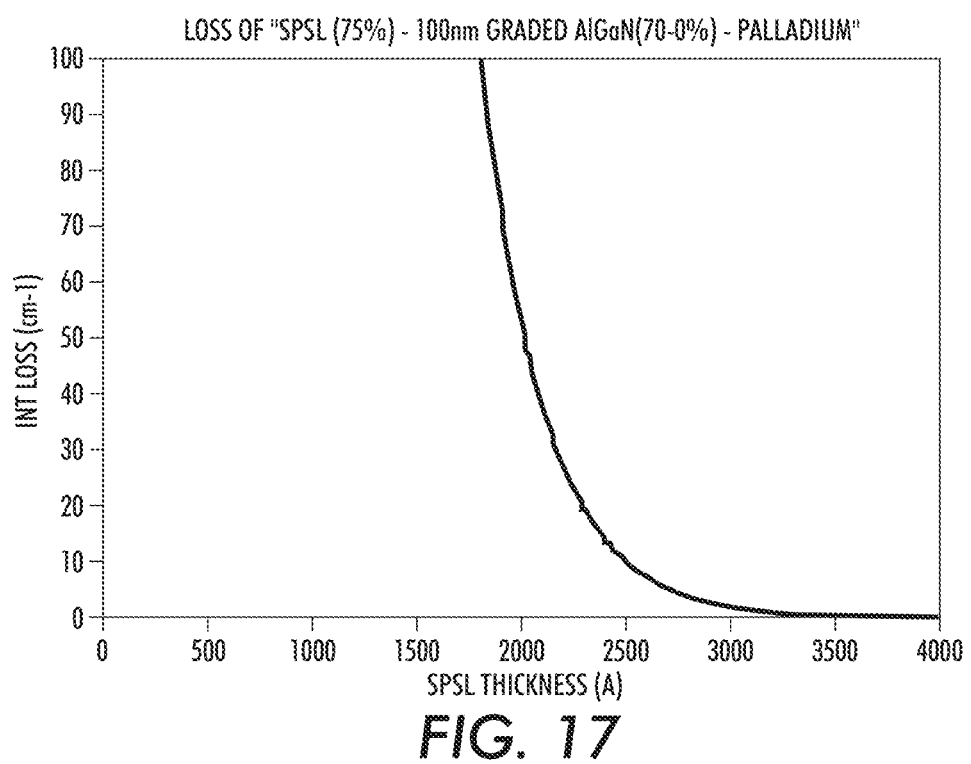
FIG. 17 shows the intensity loss with respect to thickness of an SPSL having with $x_{high}=1.0$ and $x_{low}=0.5$ used in conjunction with a graded AlGaN p-contact layer having an Al composition that grades from 0.7 at the SPSL to 0 at the palladium (Pd) p-contact.

The thickness and the effective index of refraction of the SPSL should be sufficient to prevent the lasing mode from overlapping with absorbing regions, such as the graded layer and metal contacting electrode. FIG. 17 shows the intensity loss with respect to SPSL thickness of a AlGaN/AlN superlattice with $x_{high}$=1.0 and $x_{low}$=0.5 used in conjunction with a graded AlGaN p-contact layer having an Al composition that grades from 0.7 at the SPSL to 0 at the palladium (Pd) p-contact. Based on the optical modeling shown in FIG. 17, total thickness of such an SPSL should be greater than about 250 nm (2500 Å) to reduce the combined absorption loss in the graded p-contact layer and the Pd metal contact to below 10 $cm^{-1}$. This absorption loss should be sufficient to obtain lasing.

Figure 18:
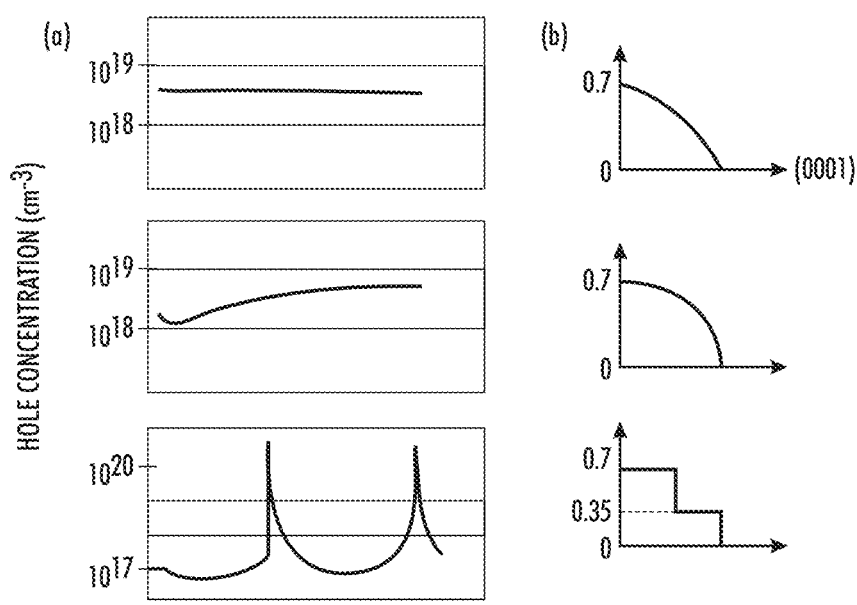
FIG. 18 illustrates three examples of hole concentrations calculated for several non-linear graded profiles.

It may be beneficial to vary the Al composition non-linearly. FIG. 18 illustrates three examples of hole concentrations calculated for several non-linear graded Al composition profiles. Graphs depicting three exemplary non-linear profiles are provided at the right side of FIG. 18. At the left side of FIG. 18, hole concentrations produced by the non-linear configurations are shown. FIG. 18 depicts three example profiles and corresponding hole concentrations denoted as top, middle, and bottom examples. In each example, the Al composition decreases from 0.7 to zero over a 100 nm distance.

An appropriate grading profile sustains a high hole concentration, ($10^{18}$-$10^{19}$ $cm^{-3}$) across substantially all of the p-contact layer. The slightly non-linear profile shown in the top example of FIG. 18 provides a substantially uniform and high concentration across the profile distance. In the middle and bottom examples, the Al composition profile changes over a substantial majority of the profile distance. The profile shown in the middle example is more non-linear when compared to the top profile, and has slightly higher hole concentration at side of the layer that would be proximate the p-contact when compared to the top example. A "step profile," as shown in the bottom example of FIG. 18, leads to an accumulation of holes at the interfaces and reduced hole concentrations in regions between the interfaces. The regions of lower hole concentration are more resistive (~$10^{17}$ $cm^{-3}$) and therefore in many cases the top and middle profiles would be more desirable.

Linear graded, parabolic graded, and graded "S" profiles may be considered for the p-contact layer. In these configurations, the Al composition in the p-contact layer is higher at or near the interface between the p-side heterostructure and the p-contact layer and when compared to the Al composition at or near the interface between the p-contact layer and the p-contact. The graded profiles in the p-contact layer include an Al composition changes over a substantial majority of the distance between the p-side heterostructure and the p-contact. Both "parabolic" and "S" designs utilize built-in piezoelectric and spontaneous polarization and can induce over $1 \times 10^{18}/cm^3$ hole concentration across the layers in simulation. The S design can effectively suppress the absorption loss from the contact and the layer itself to 14 $cm^{-1}$, which is about one third of linear (40 $cm^{-1}$) and/or parabolic (44 $cm^{-1}$) designs. An appropriate design rule for an S-graded layer includes that the Al composition of AlGaN that gives the highest refractive index at the lasing wavelength should occur at the waist of S. The "waist" of the S profile, $d_w$, is an inflection point where the curve corresponding to Al composition vs. distance has a change in curvature from positive to negative.

Absorption losses increase with decreasing Al composition. Designs that sweep z in an $Al_zGa_{1-z}N$ composition of the graded p-contact layer from a Δz value (at the SPSL) to a lower value e.g., zero, (at the p-contact) may result in light from the active region propagating along or through a lossy region of the p-contact layer. For a laser diode, it is optimal to keep absorption losses below a minimal value, and this places restrictions on the Al composition in the graded p-contact region. It is possible to reduce the absorption losses in the graded p-contact layer by the choice of Al composition profile in this region. In some cases discussed herein, nonlinear graded layer designs can be used to suppress the absorption loss and induce a three dimensional hole gas simultaneously for laser diode applications.

Figure 19:
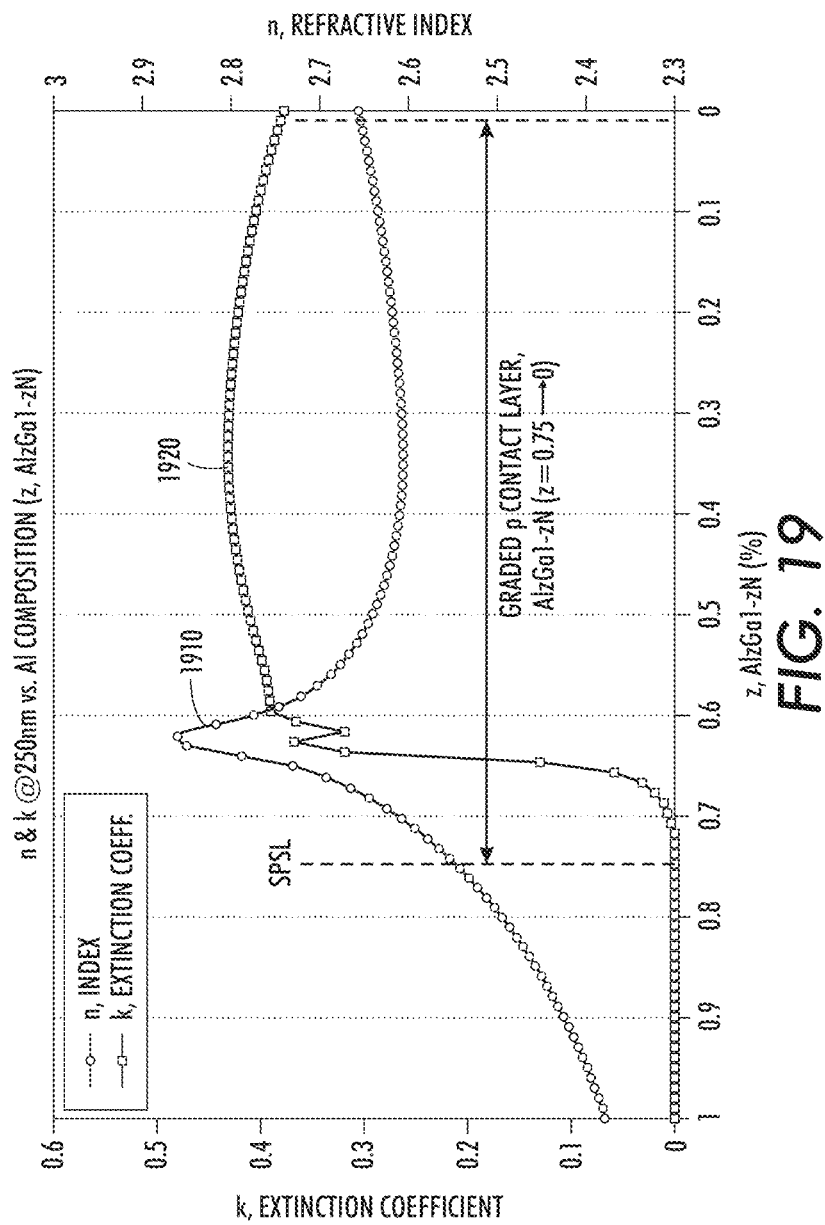
FIG. 19 is a graph of the refractive index, n, and extinction coefficient, k, with respect to Al composition for wavelength λ=250 nm in an $Al_zGa_{1-z}N$ layer.

FIG. 19 is a graph that plots the refractive index 1910, n, and extinction coefficient 1920, k, with respect to Al composition for wavelength, λ=250 nm in a graded $Al_zGa_{1-z}N$ p-contact layer. The peak in the refractive index and the sharp increase in the extinction coefficient occur at the value of z where the energy band gap of $Al_zGa_{1-z}N$ is nearly equal to the energy of light having wavelength of 250 nm. This wavelength corresponds to an energy of about 4.96 eV and a value of z of about 0.62. We refer to this value of z as $z_{gap}(\lambda)$. The band gap of $Al_zGa_{1-z}N$ is approximately equal to $E_{gap}(eV)$= 6.2 z+3.4 (1-z)–0.7 z(1-z). $z_{gap}(\lambda)$ is equal approximately to the solution of the equation 1240/λ=6.2 z+3.4 (1-z)–0.7 z(1- z) with λ expressed in nm. For values of z less than 0.62 the absorption of light in $Al_zGa_{1-z}N$ increases. The extinction coefficient, k, relates to the absorption of light in the layer. In this simulation, the refractive index of $Al_zGa_{1-z}N$, where z decreases from 1 to 0 is simulated and plotted for λ=250 nm in FIG. 19. The average composition of the SPSL requires z to be higher than 0.62 in order to provide optical mode confinement (low refractive index) and high transparency (low k). To avoid the discontinuity at the interface between the SPSL and the graded p-contact layer, the grading starts from Al composition of the SPSL, e.g., z=0.75, and then continuously decreases to z=zero (GaN) across a thickness. GaN at the metal contact allows for the establishment of an ohmic contact.

Figure 22:
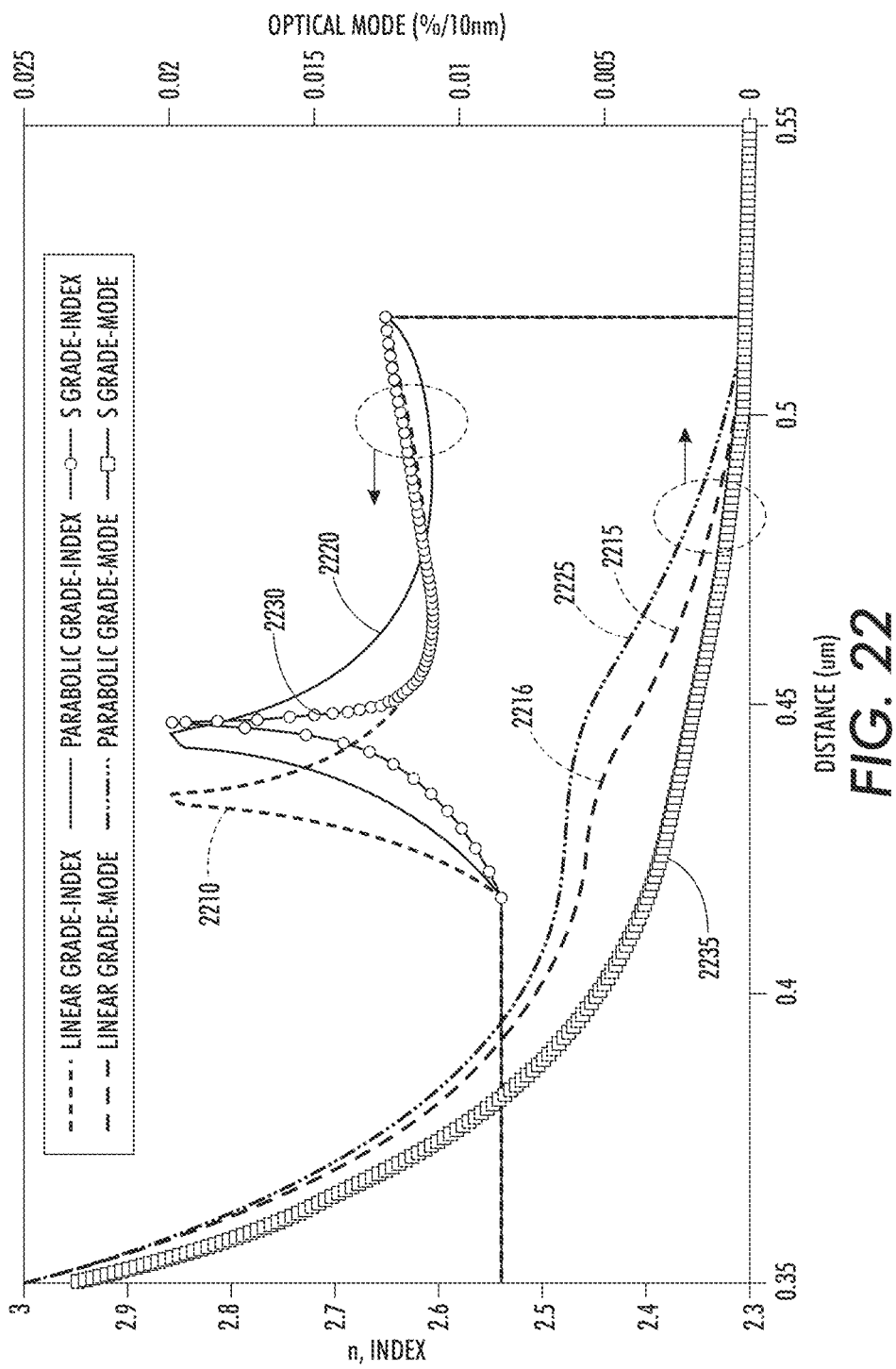
FIG. 22 provides the refractive index and transverse optical mode plots for the Al composition profiles of FIG. 20.

From simulations of the amplitude of the optical mode we find that high values of the refractive index n near the refractive index peak region can cause the mode to extend more into the lossy region. By reducing the width of the peak in n as a function of distance (as shown in FIG. 22) the loss can be reduced. By reducing the thickness of $Al_zGa_{1-z}N$ regions for which z is near $z_{gap}(\lambda)$ the loss can be reduced. Reduction in the thickness of $Al_zGa_{1-z}N$ regions for which z is near $z_{gap}(\lambda)$ can be achieved by careful choice of the Al grading profile. A "pinning waveguide" is formed in the graded layer when sweeping z across the average Al composition of 0.62. This local energy trap attracts the optical mode and therefore enhances the overlaps with absorbing portion (higher k). In other words, the mode tends to be "attracted" to regions where the material exhibits a relatively higher index of refraction. If the mode extends more into regions with higher loss, then the total loss will be greater.

To study the loss resulting from different Al grading profiles three designs were compared. The first example involves a linear graded p-contact layer that starts with an Al composition of z=0.75 at d=0 at the interface between the SPSL and the p-contact layer and decreases to z=0 at d=D at the interface between the p-contact layer and the p-contact, as shown in trace 2010 of FIG. 20. The second example, shown by trace 2020, involves a parabolic Al composition profile that varies z parabolically with distance, d, from d=0 to d=D according to the equation $d=-133.3z^2-33.3z+100$, where 0.75>z>0, as shown in trace 2020. A third example, shown in trace 2030, involves an S-graded design (similar to a flipped S-shape) comprising two parabolic segments, which are connected at the inflection point of the curve. In this example, the first parabolic segment is characterized by $d=-1602.5z^2-1964.7z-572$, where 0.75>z>0.62. The second parabolic segment is characterized by $d=147.8z^2-204.6z+100$ where 0.62>z>0. In general, where d is distance in the p-contact layer, d=0 at an interface between the p-side heterostructure and the p-contact layer, d=D at an interface between the p-contact layer and the p-contact, and $d_W$ is a point between d=0 and d=D. An S-shaped profile in the p-contact layer includes a first portion in which z is concave downward between the d=0 and $d=d_W$ and a second portion in which z is concave upward from $d=d_W$ to d=D. In some cases, $d_W$ is greater than about 30% of the total thickness of the p-contact layer. The total thickness of the p-contact layer, D, may be about 100 nm, for example. In various implementations of the S-shaped profile, z can decrease from about 0.7 proximate to the p-side heterostructure, e.g., at d=0, to about 0 proximate to the p-contact, e.g., at d=D.

Figures 20, 21:
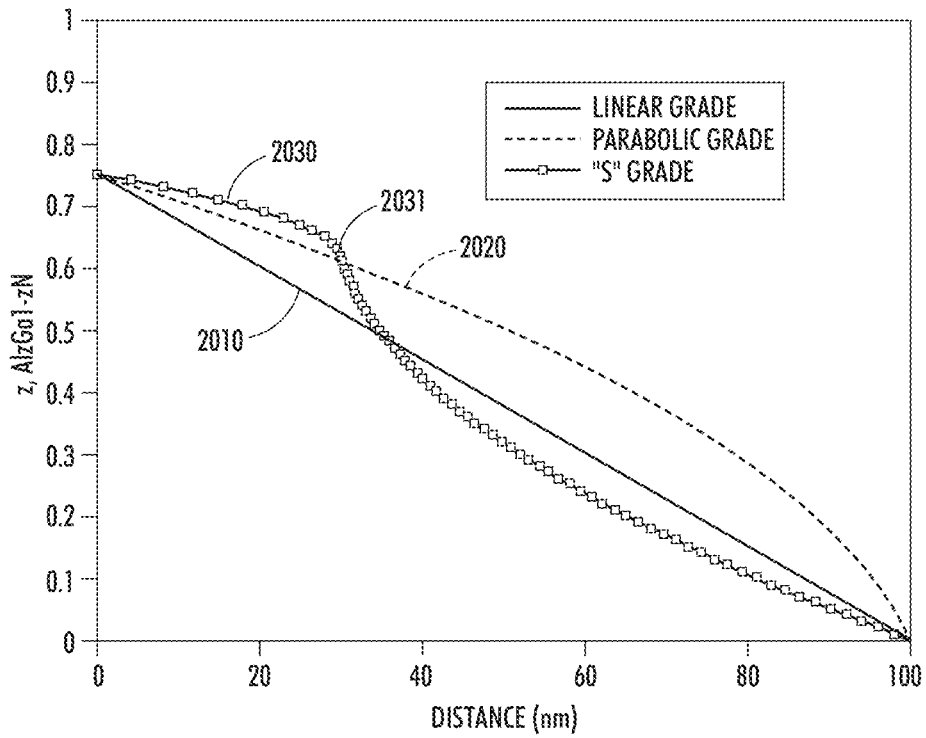
FIG. 20 illustrates linear, parabolic, and S-shaped Al composition profiles.
FIG. 21 provides tables of values of z at various distances within the p-contact layer for each of the Al composition profiles of FIG. 20.

The tables shown in FIG. 21 provide values of z at various values of d for each of the profiles. The inflection point, $d_w$, 2031 (also denoted the "waist") of the S-curve of FIG. 20 occurs at $d_w$=30 nm and z=0.62. The inflection point 2031 occurs at a point where the Al composition is approximately equal to $z=z_{gap}$(250 nm) in this example.

The refractive index and transverse optical mode of the three example designs were simulated, and are shown in FIG. 22. Traces 2210, 2220, 2230 show the refractive index of the linear, parabolic, and S profiles, respectively, with respect to distance. Traces 2215, 2225, 2235 show the optical mode for the linear, parabolic, and S profiles, respectively, with respect to distance. In the linearly graded design the relatively broad peak in the index induces a hump 2216 in the optical mode plot 2215. The hump 2216 in the optical mode 2215 of the linear profile may increase the optical loss since it causes an increased extension of the optical mode into lossy material where z<0.62. The loss incurred in the linear design is 40 $cm^{-1}$. The optical mode trace 2225 for the parabolic graded profile pushes the point for which the peak index occurs to a larger distance from the interface between the p-contact layer and the SPSL. However, the width of the index peak is increased by the parabolic design, and as a result, the optical loss incurred in the parabolic design (44 $cm^{-1}$) is greater than in the linear graded design. In the S-shaped design, the peak is narrowed, as shown in trace 2230. The distance from interface to the index peak is extended in the S design and this helps to suppress the loss. The absorption loss in the S-shaped design is reduced to about 14 $cm^{-1}$. This absorption loss is about one third of 40 $cm^{-1}$ and 44 $cm^{-1}$ of linear and parabolic designs, respectively.

Figure 23:
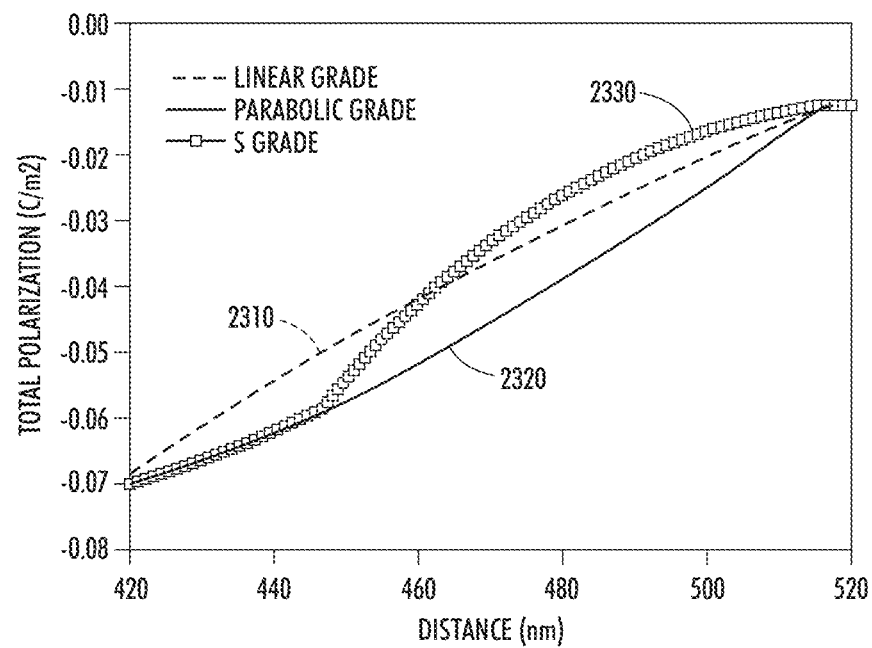
FIG. 23 provides the total polarization for the Al composition profiles of FIG. 20.
Figure 24:
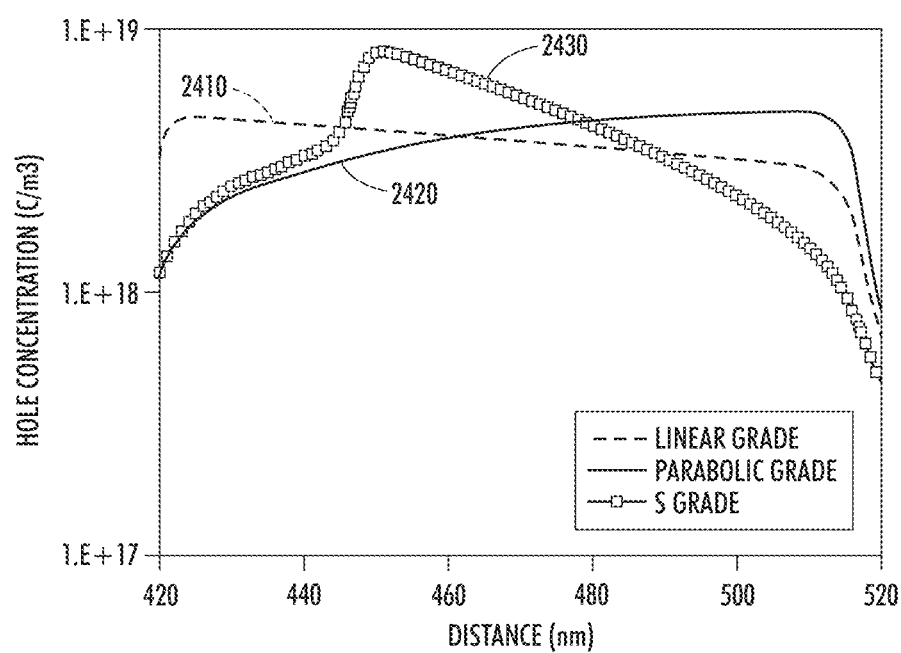
FIG. 24 provides the hole concentration for the Al composition profiles of FIG. 20.

Piezoelectric plus spontaneous polarization fields of the three designs were simulated. FIG. 23 provides graphs 2310, 2320, 2330 of the total polarization for the linear, parabolic and S profiles, respectively. The corresponding hole concentrations induced by polarization at zero voltage for the linear 2420, parabolic 2420, and S-shaped profiles 2430, respectively, are plotted in FIG. 24. All three designs enable the hole concentration to exceed $1\times10^{18}/cm^3$ across the p-contact layer.

Review of the three designs indicates that in some cases, the S profile shows superior properties when compared with the properties of the parabolic and linear designs. The S-shaped profile simultaneously suppresses optical loss and maintains high hole concentration across the p-contact layer. It may be noted that the Al composition at the inflection point of the S-profile design is very close to the Al composition of the device quantum wells.

An appropriately designed graded p-contact layer in a light emitting device can enable the use of an SPSL having a reduced thickness when compared with a light emitting device employing a p-contact layer having a substantially constant Al composition. For example, in a piece-wise linearly graded p-contact layer, where d is distance in the p-contact layer, z decreases linearly with slope $g_1$ in a first region (see, e.g., Region I of FIG. 13) extending from d=0 at an interface between the p-side heterostructure) and the p-contact layer to $d=d_{mid}$, and z decreases linearly with slope $g_2$ in a second region (see, e.g., Region II of FIG. 13) extending from $d=d_{mid}$ to d=D at an interface between the p-contact layer and the p-contact. In some implementations, a magnitude of $g_2$ is greater than a magnitude of $g_1$. For this piecewise linear configuration, a thickness of the SPSL may be less than about 260 nm for $d_{mid}$ greater than about 60 nm.

As another example, for an S-shaped Al composition profile, where d is distance in the p-contact layer, d=0 at an interface between the p-side heterostructure and the p-contact layer, d=D at an interface between the p-contact layer and the p-contact, and $d_W$ is a point between d=0 and d=D. The p-contact layer includes a first portion in which z is concave downward between the d=0 and $d=d_W$ and a second portion in which z is concave upward from $d=d_W$ to $d=D$. For a p-contact layer having an S-shaped Al composition, the thickness of the SPSL may be less than about 260 nm for $d_W$ greater than about 60 nm.

Figure 25:
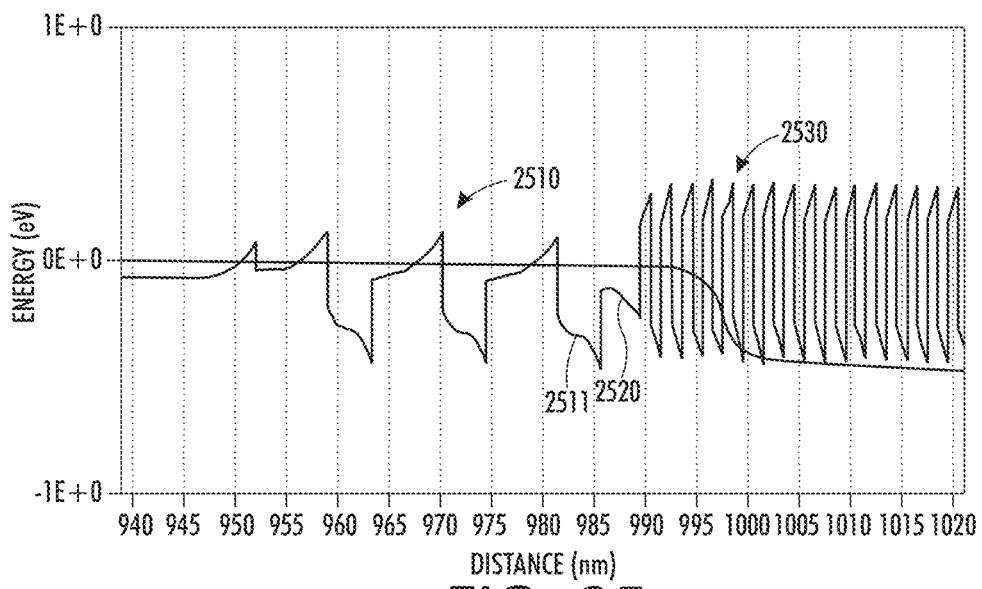
FIG. 25 is an energy diagram that shows the conduction band energy in the region of the quantum wells, in the region of the last barrier of the active region and in the region of the polarization enhanced SPSL.

In some embodiments, as illustrated in the energy diagram of FIG. 25, the SPSL layers may extend to the active region. FIG. 25 is an energy diagram that shows the conduction band energy in the region of the quantum wells 2512, in the region of the last barrier 2520 of the active region and in the region of the polarization enhanced SPSL 2530. The polarization enhanced SPSL 2530 is immediately adjacent to the last barrier 2520 which in turn is immediately adjacent the last quantum well 2511 of the active region. In this example, the SPSL has the composition $x_{high}=0.74$, $x_{low}=0.44$, $T_{high}=1$ nm and $T_{low}=1$ nm throughout the SPSL.

Figure 26:
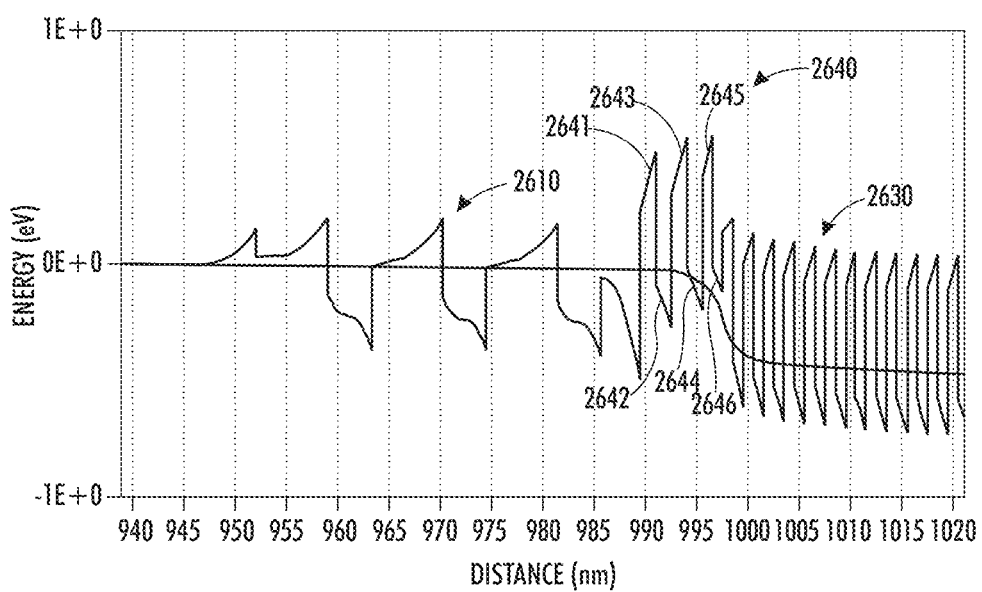
FIG. 26 is an energy diagram of an SPSL that is modified near the active region to form a section of the SPSL that provides the functionality of an electron blocking layer (EBL) for the active region.

In some cases, the dimensions and/or composition of the SPSL may be modified near the active region forming a section of the SPSL that provides the functionality of an electron blocking layer (EBL) for the active region. An example of this approach is illustrated by the conduction band energy diagram of FIG. 26. In this example, several of the SPSL layers, e.g., about six SPSL layers near the active region 2610, form a multilayer electron blocking section (MEBS) 2640. The SPSL layers of the MEBS 2640 have modified thickness and/or composition ($T_{high}$, $T_{low}$, $x_{high}$, $x_{low}$) when compared to the standard layers of the SPSL 2630. In the example shown in FIG. 26, $x_{high}$ and $x_{low}$ of the standard SPSL layers are 0.74 and 0.44, respectively; $T_{high}$ and $T_{low}$ of the standard SPSL layers are both 1.0 nm and 1.0 nm. In the example shown in FIG. 26, layer 2641 has $x_{high}=0.87$ and $T_{high}=1.5$ nm; layer 2642 has $x_{low}=0.62$ and $T_{low}=1.5$ nm; layer 2643 has $x_{high}=0.87$ and $T_{high}=1.5$ nm; layer 2644 has $x_{low}=0.62$ and $T_{low}=1.5$ nm; layer 2645 has $x_{high}=0.87$ and $T_{high}=1.0$ nm; and layer 2646 has $x_{low}=0.62$ and $T_{low}=1.0$ nm. Other values of $x_{high}$, $x_{low}$, $T_{high}$, $T_{low}$ are possible so long as the Al compositions and/or layer thicknesses of the MEBS layers are selected to provide significant retention of electrons in the active region.

Systems, devices or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the following detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in view of the above teaching.

The invention claimed is:

1. A light emitting device, comprising:
a p-side heterostructure comprising a short period superlattice (SPSL) including alternating layers of $Al_{xhigh}Ga_{1-xhigh}N$ doped with a p-type dopant and $Al_{xlow}Ga_{1-xlow}N$ doped with the p-type dopant, where $x_{low} \leq x_{high} \leq 0.9$ and each layer of the SPSL has a thickness of less than or equal to six bi-layers of AlGaN, each bi-layer being one layer of Al and Ga atoms and one layer of N atoms and having a thickness of 0.25 nm;
an n-side heterostructure; and
an active region configured to emit light disposed between the SPSL and the n-side heterostructure, wherein
a difference between $x_{low}$ and xhigh in the alternating layers causes modulation of a valance band edge energy in the SPSL, and
the modulation of the valence band edge energy in the SPSL is at least an acceptor energy level of the p-type dopant.

2. The device of claim 1, wherein each $Al_{xhigh}Ga_{1-xhigh}N$ layer has a thickness, $T_{high}$, and each $Al_{xlow}Ga_{1-xlow}N$ layer has a thickness $T_{low}$, wherein $T_{high}$ and $T_{low}$ are in a range of 0.7 nm to 1.3 nm.

3. The device of claim 1, wherein the SPSL has a total thickness of greater than 200 nm and less than 450 nm.

4. The device of claim 1, wherein $x_{high}-x_{low}$ is greater than or equal to 0.25.

5. The device of claim 1, wherein an average Al composition in the SPSL is 0.60.

6. The device of claim 1, wherein $x_{low}$ is 0.44 and $x_{high}$ is 0.75.

7. The device of claim 1, wherein a resistivity of the SPSL changes by less than 50 Ω-cm over a temperature range of 400 K to 100 K.

8. The device of claim 1, wherein a resistivity of the SPSL is less than 10 Ω-cm at room temperature.

9. The device of claim 1, wherein the n-side heterostructure, active region, and p-side heterostructure are grown on at least one of a substrate comprising one or more of GaN, AlN, SiC, sapphire, Si, GaAs, ZnO, a group III-N alloy, and a template comprising a group III-N material.

10. The device of claim 1, wherein the n-side heterostructure, active region, and p-side heterostructure are epitaxially grown on a bulk AlN substrate.

11. The device of claim 1, further comprising a substrate of sapphire, a group-III nitride, SiC, or ZnO, wherein the n-side heterostructure, active region, and p-side heterostructure are epitaxially grown on an (0001) or ($000\bar{1}$) surface of the substrate.

12. The device of claim 1, further comprising a substrate of a group-III nitride, SiC, or ZnO, wherein the n-side heterostructure, active region and p-side heterostructure are epitaxially grown on a semi-polar facet of the substrate.

13. The device of claim 1, wherein the modulation of the valence band energy edge is equal to a sum of a valence band offset between the alternating layers in the SPSL and a change in potential within a layer of the SPSL arising from polarization charges at interfaces of the alternating layers.

14. The device of claim 13, wherein:
$E_{gap}$ is a difference between a valence band energy and a conduction band energy; and
the valence band offset is equal to $0.3\{E_{gap}(Al_{xhigh}Ga_{1-xhigh}N)-E_{gap}(Al_{xlow}Ga_{1-xlow}N)\}$,
and wherein:
$P_x$ is a total polarization of $Al_xGa_{1-x}N$, $\in_x$ is a dielectric constant of $Al_xGa_{1-x}N$; and the change in potential within a layer of the SPSL arising from polarization charges at interfaces is equal to $T_{high}T_{low}(P_{xlow}-P_{xhigh})/(T_{high}\in_{xlow}+T_{low}\in_{xhigh})$.

15. The device of claim 1, wherein the p-type dopant is Mg and the modulation of the valence band edge is greater than 0.35 eV.

16. The device of claim 1, further comprising:
a metallic p-contact; and
a p-contact layer disposed between the p-side heterostructure and the p-contact, the p-contact layer comprising $Al_zGa_{1-z}N$ and having a thickness, D, where z varies over the thickness of the p-contact layer.

17. The device of claim 16, wherein:
z is a function of distance, d, over the thickness of the p-contact layer, wherein the thickness of the p-contact layer extends from d=0 at an interface between the p-side heterostructure and the p-contact layer to d=D at an interface between the p-contact layer and the p-contact;
the function z decreases linearly with slope $g_1$ in a first region extending from d=0 to d=$d_{mid}$, wherein $d_{mid}$ is a point within the p-contact layer between d=0 and d=D; and
the function z decreases linearly with slope $g_2$ in a second region extending from d=$d_{mid}$ to d=D, wherein a magnitude of $g_2$ is greater than a magnitude of $g_1$.

18. The device of claim 17, wherein a thickness of the SPSL is less than 260 nm and $d_{mid}$ is greater than 60 nm.

19. The device of claim 16, wherein:
d is distance in the p-contact layer;
d=0 at an interface between the p-side heterostructure and the p-contact layer;
d=D at an interface between the p-contact layer and the p-contact;
$d_W$ is a point within the p-contact layer between d=0 and d=D;
z is a function of the distance, d, over the thickness of the p-contact layer, wherein the thickness of the p-contact layer extends from d=0 at the interface between the p-side heterostructure and the p-contact layer to d=D at the interface between the p-contact layer and the p-contact; and
the p-contact layer includes:
a first portion in which the function z is concave downward between d=0 and d=$d_W$; and
a second portion in which the function z is concave upward from d=$d_W$ to d=D.

20. The device of claim 1, wherein a lateral resistivity of the SPSL increases by less than a factor of 5 as the temperature T increases from 1000/10 Kelvins to 1000/3 Kelvins.

* * * * *